United States Patent
Lilak et al.

(10) Patent No.: US 11,616,056 B2
(45) Date of Patent: Mar. 28, 2023

(54) VERTICAL DIODE IN STACKED TRANSISTOR ARCHITECTURE

(71) Applicant: INTEL CORPORATION, Santa Clara, CA (US)

(72) Inventors: Aaron D. Lilak, Beaverton, OR (US); Patrick Morrow, Portland, OR (US); Anh Phan, Beaverton, OR (US); Cheng-Ying Huang, Hillsboro, OR (US); Rishabh Mehandru, Portland, OR (US); Gilbert Dewey, Beaverton, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 271 days.

(21) Appl. No.: 16/649,712

(22) PCT Filed: Jan. 18, 2018

(86) PCT No.: PCT/US2018/014267
§ 371 (c)(1),
(2) Date: Mar. 23, 2020

(87) PCT Pub. No.: WO2019/143340
PCT Pub. Date: Jul. 25, 2019

(65) Prior Publication Data
US 2020/0258881 A1 Aug. 13, 2020

(51) Int. Cl.
*H01L 27/06* (2006.01)
*H01L 21/8252* (2006.01)
(Continued)

(52) U.S. Cl.
CPC ...... *H01L 27/0605* (2013.01); *H01L 21/8252* (2013.01); *H01L 27/0629* (2013.01);
(Continued)

(58) Field of Classification Search
CPC ............ H01L 27/0605; H01L 27/0629; H01L 27/0922; H01L 29/2003; H01L 29/205;
(Continued)

(56) References Cited

U.S. PATENT DOCUMENTS

| 8,793,528 B2 | 7/2014 | Sivaramakrishnan et al. |
| 10,079,228 B1 * | 9/2018 | Balakrishnan ...... H01L 29/0688 |

(Continued)

FOREIGN PATENT DOCUMENTS

WO 2019143340 A9 7/2019

OTHER PUBLICATIONS

International Preliminary Report on Patentability dated Jul. 21, 2020 for International Patent Application PCT/US2018/014267, 10 pages.

(Continued)

*Primary Examiner* — Selim U Ahmed
(74) *Attorney, Agent, or Firm* — Schwabe, Williamson & Wyatt, P.C.

(57) ABSTRACT

An integrated circuit structure includes a first semiconductor fin extending horizontally in a length direction and including a bottom portion and a top portion above the bottom portion, a bottom transistor associated with the bottom portion of the first semiconductor fin, a top transistor above the bottom transistor and associated with the top portion of the first semiconductor fin, and a first vertical diode. The first vertical diode includes: a bottom region associated with at least the bottom portion of the first semiconductor fin, the bottom region including one of n-type and p-type dopant; a top region associated with at least the top portion of the first semiconductor fin, the top region including the other of n-type and p-type dopant; a bottom terminal electrically (Continued)

connected to the bottom region; and a top terminal electrically connected to the top region at the top portion of the first semiconductor fin.

20 Claims, 13 Drawing Sheets

(51) Int. Cl.
*H01L 27/092* (2006.01)
*H01L 29/20* (2006.01)
*H01L 29/205* (2006.01)
*H01L 29/66* (2006.01)
*H01L 29/778* (2006.01)
*H01L 29/861* (2006.01)

(52) U.S. Cl.
CPC ...... *H01L 27/0922* (2013.01); *H01L 29/2003* (2013.01); *H01L 29/205* (2013.01); *H01L 29/66136* (2013.01); *H01L 29/66462* (2013.01); *H01L 29/7788* (2013.01); *H01L 29/8613* (2013.01)

(58) Field of Classification Search
CPC ......... H01L 29/66136; H01L 29/66462; H01L 29/7788; H01L 29/8613; H01L 21/8221; H01L 21/823885; H01L 27/0688; H01L 29/41708; H01L 29/36; H01L 27/1203; H01L 29/0657; H01L 29/0821; H01L 29/1004; H01L 29/165; H01L 29/42304; H01L 29/66204; H01L 29/7317; H01L 29/7371; H01L 29/78642; H01L 29/732; H01L 29/861

See application file for complete search history.

(56) References Cited

U.S. PATENT DOCUMENTS

| | | |
|---|---|---|
| 2006/0063334 A1 | 3/2006 | Donze et al. |
| 2007/0235745 A1 | 10/2007 | Hayashi et al. |
| 2008/0111120 A1* | 5/2008 | Lee .................. H01L 27/2409 257/E47.001 |
| 2010/0163821 A1* | 7/2010 | Ohashi ............... H01L 29/8615 257/E29.327 |
| 2015/0200302 A1 | 7/2015 | Doornbos et al. |
| 2015/0221632 A1 | 8/2015 | Wang et al. |
| 2017/0287902 A1* | 10/2017 | Balakrishnan ........ H01L 29/517 |

OTHER PUBLICATIONS

International Search Report and Written Opinion received for PCT Application No. PCT/US2018/014267, dated Oct. 18, 2018. 14 pages.

* cited by examiner

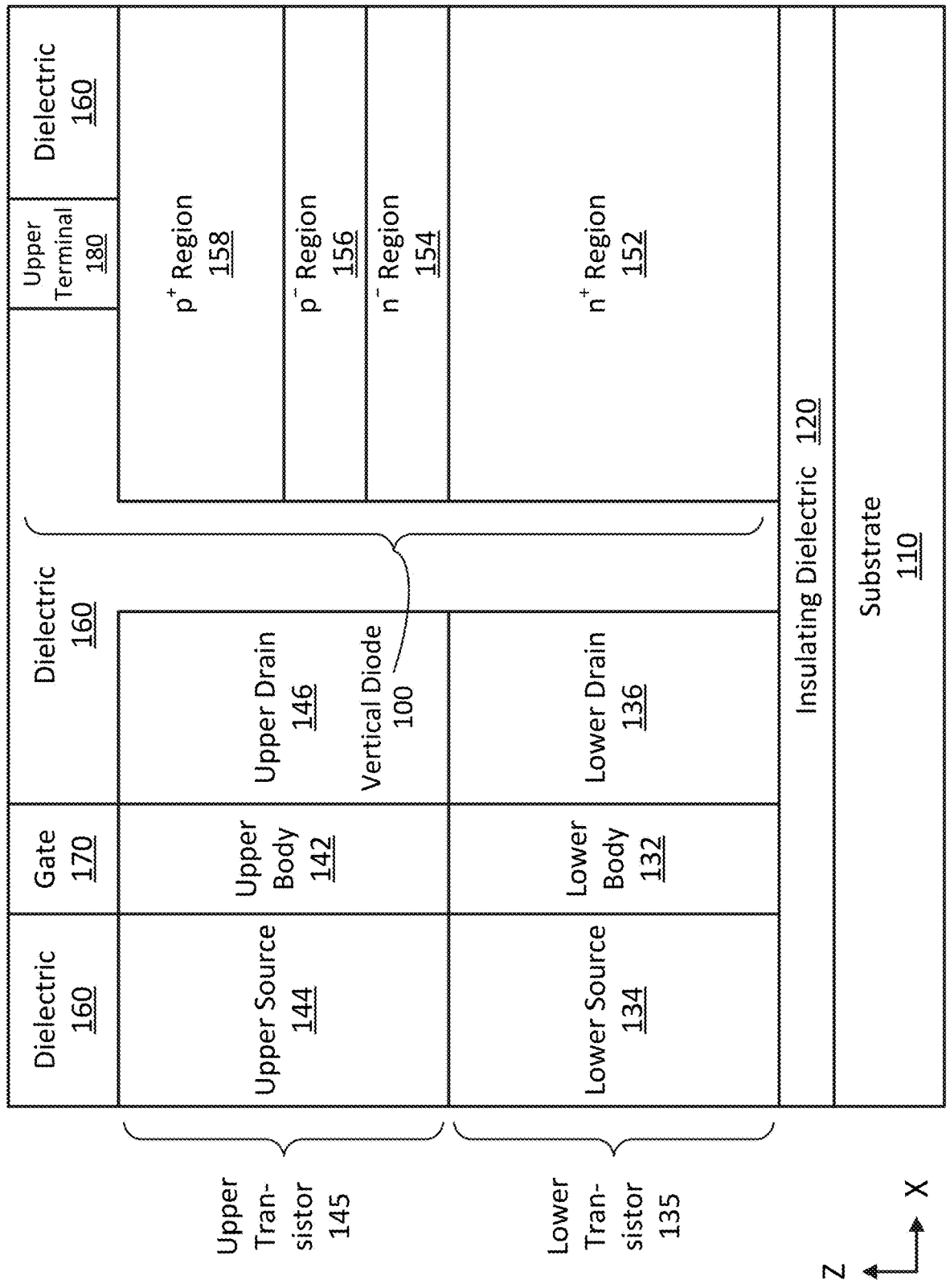

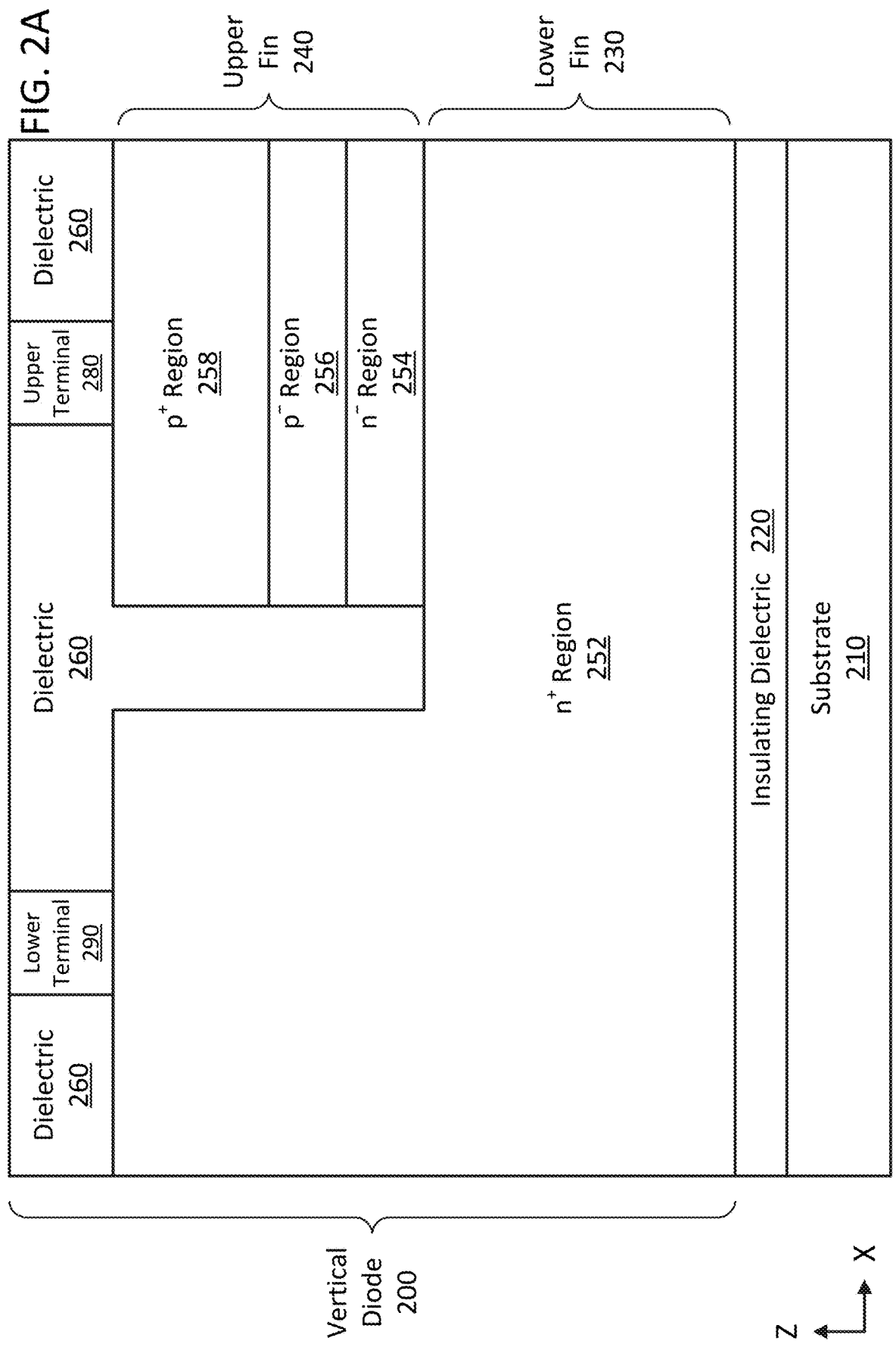

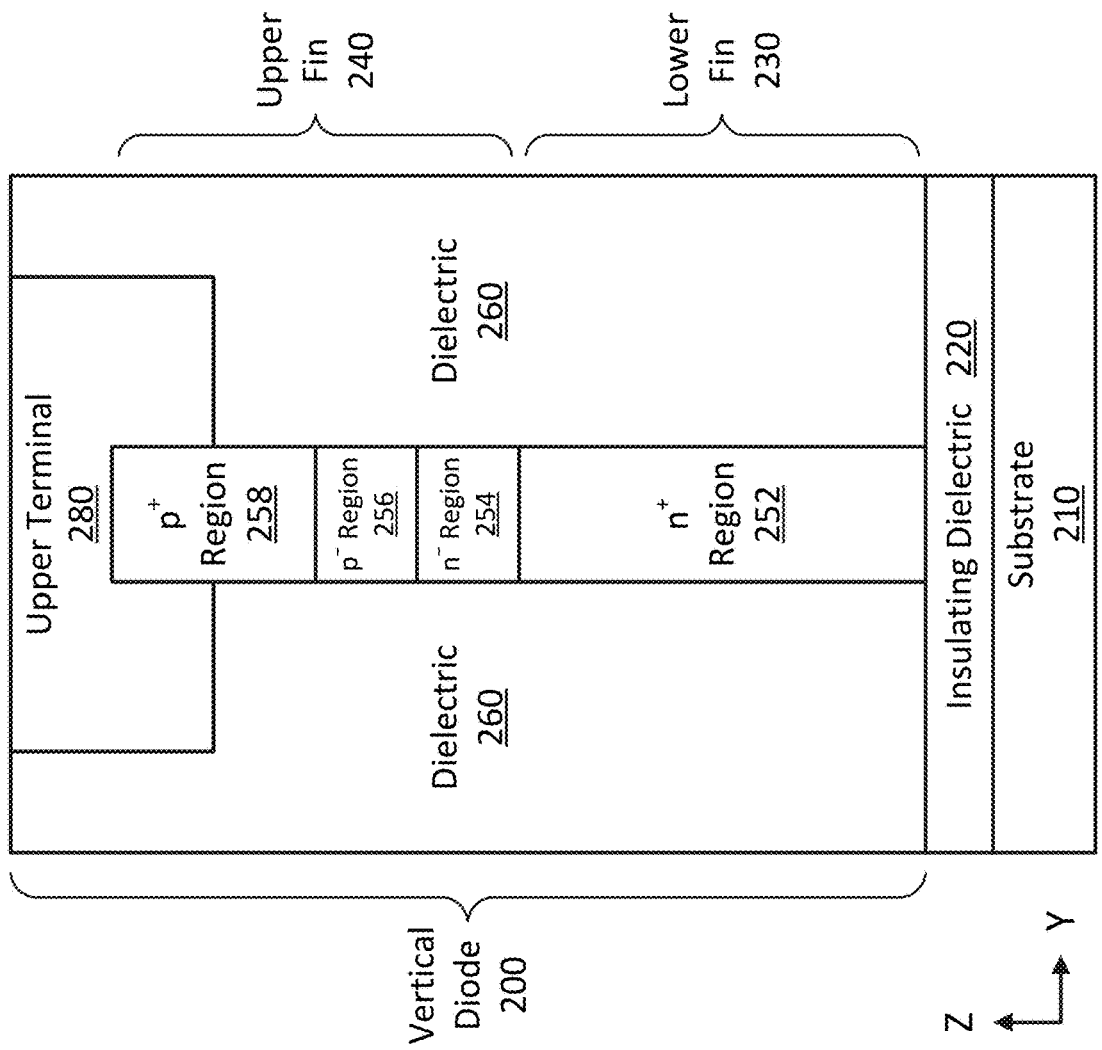
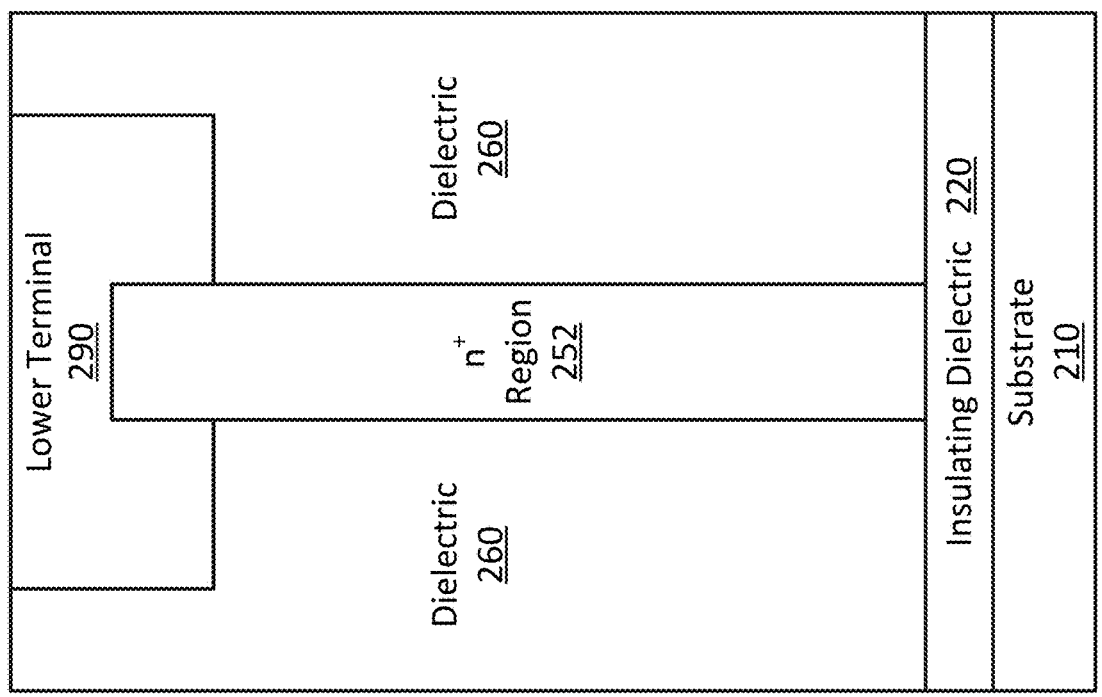

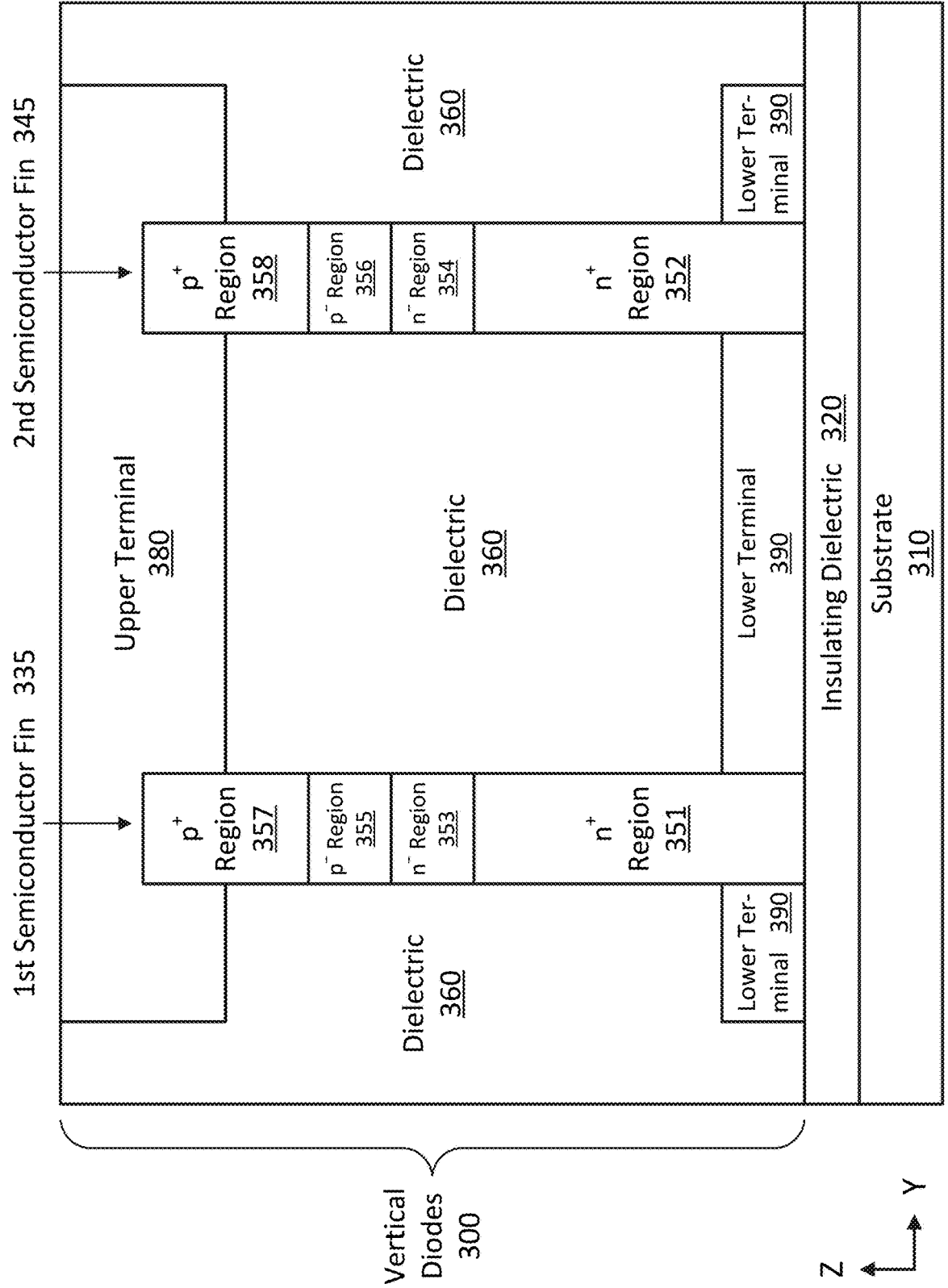

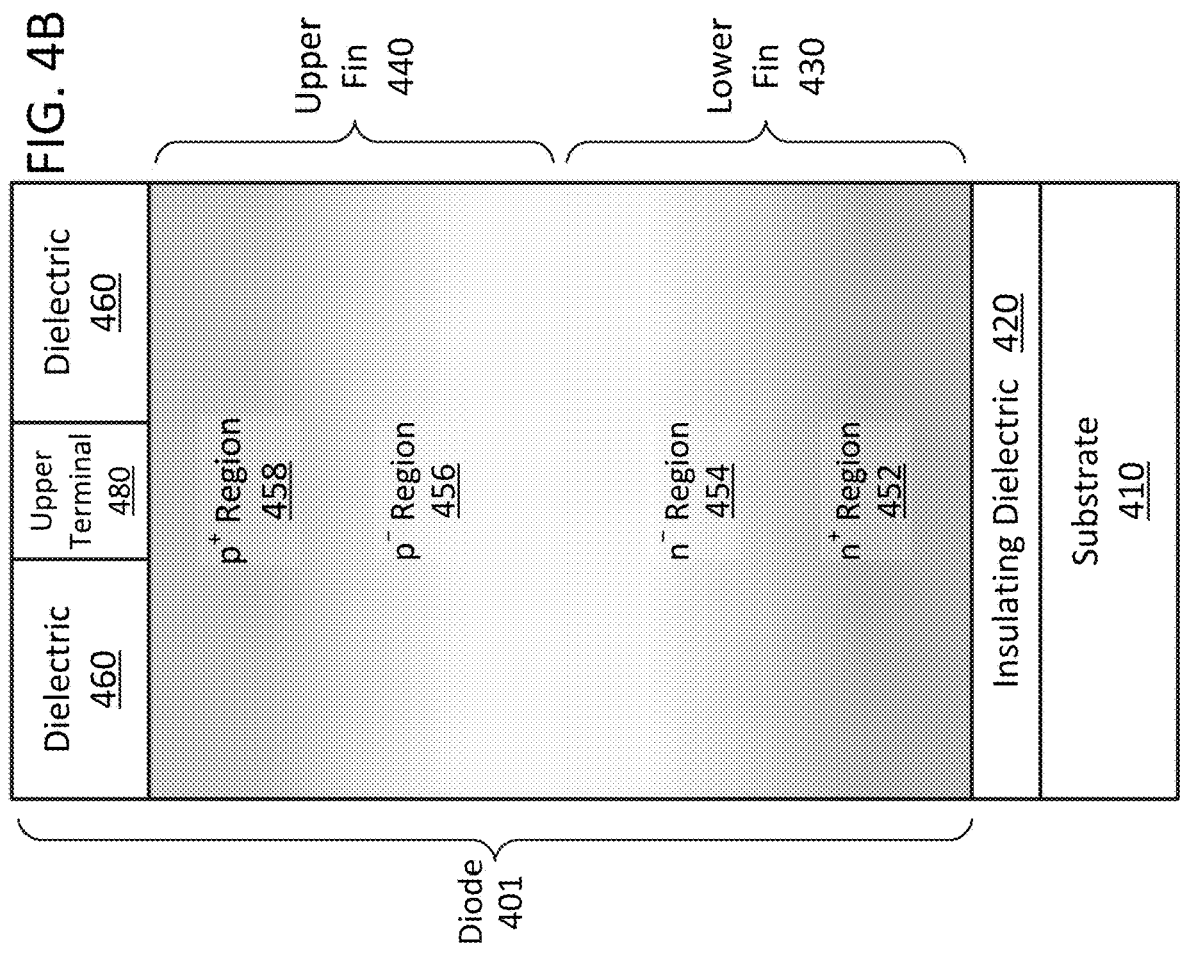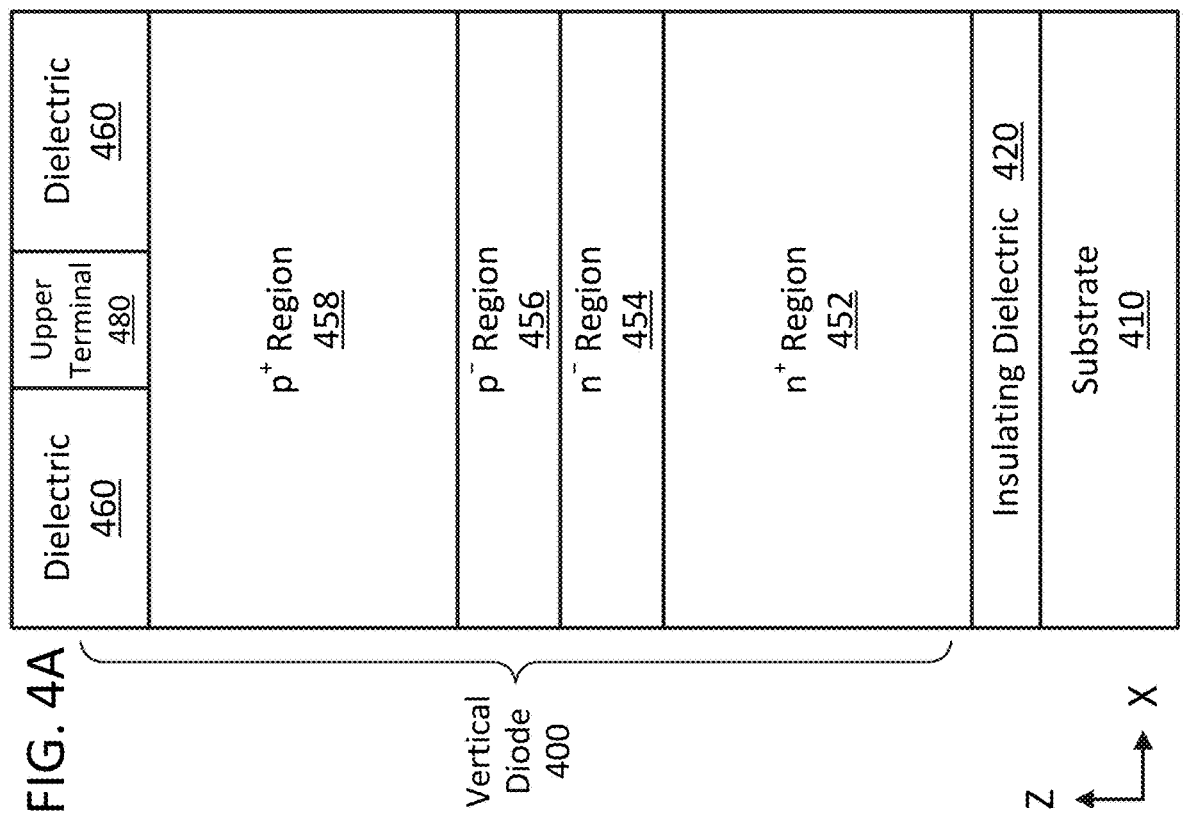

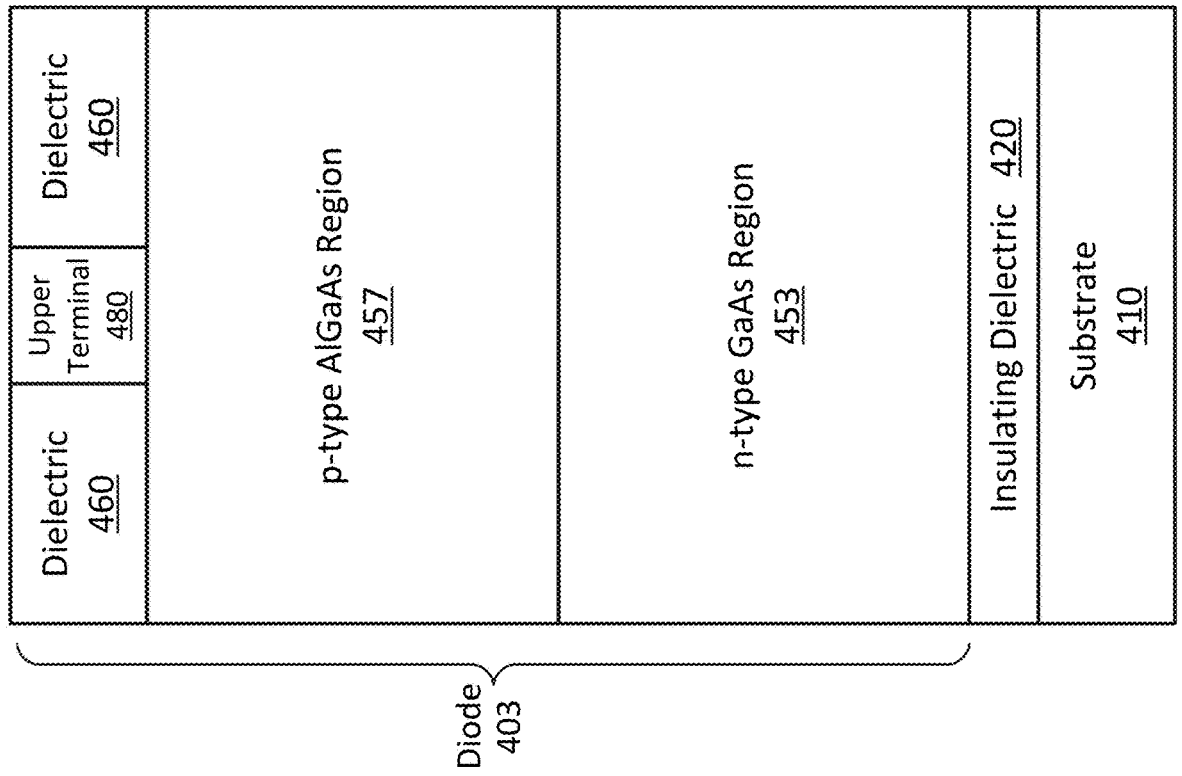
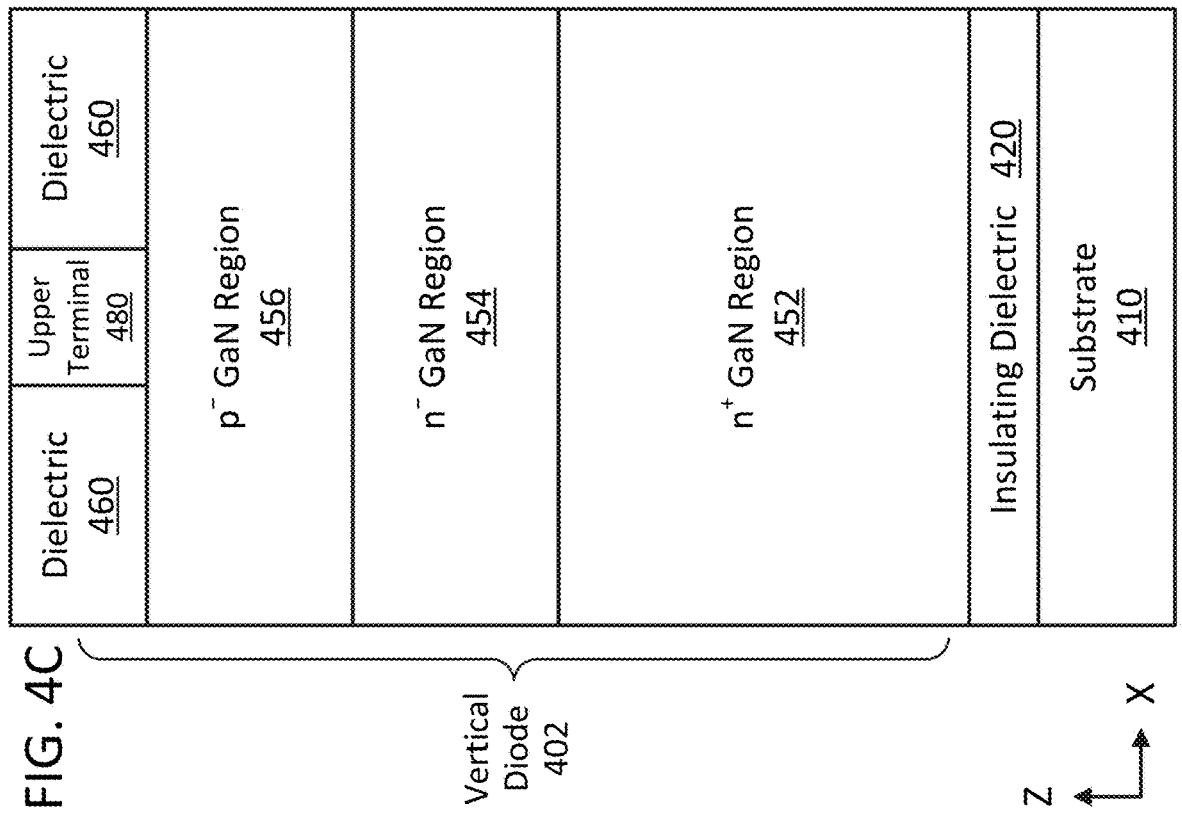

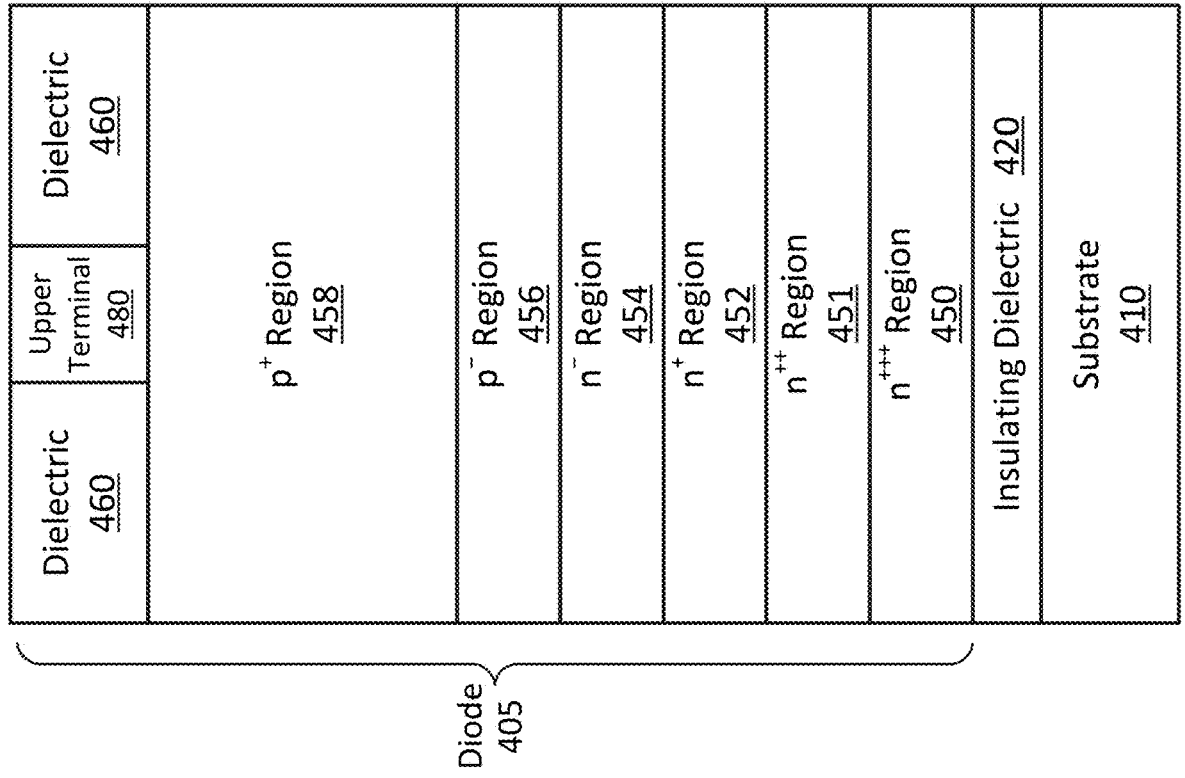
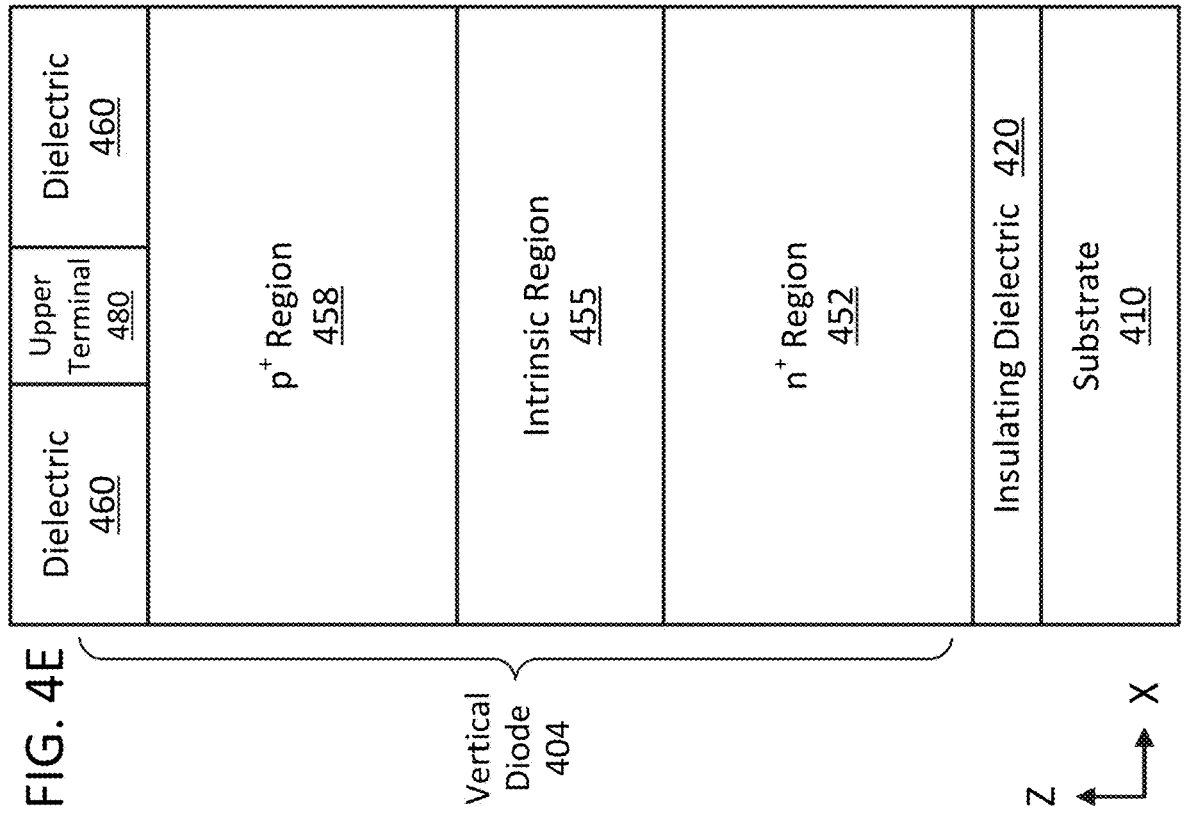

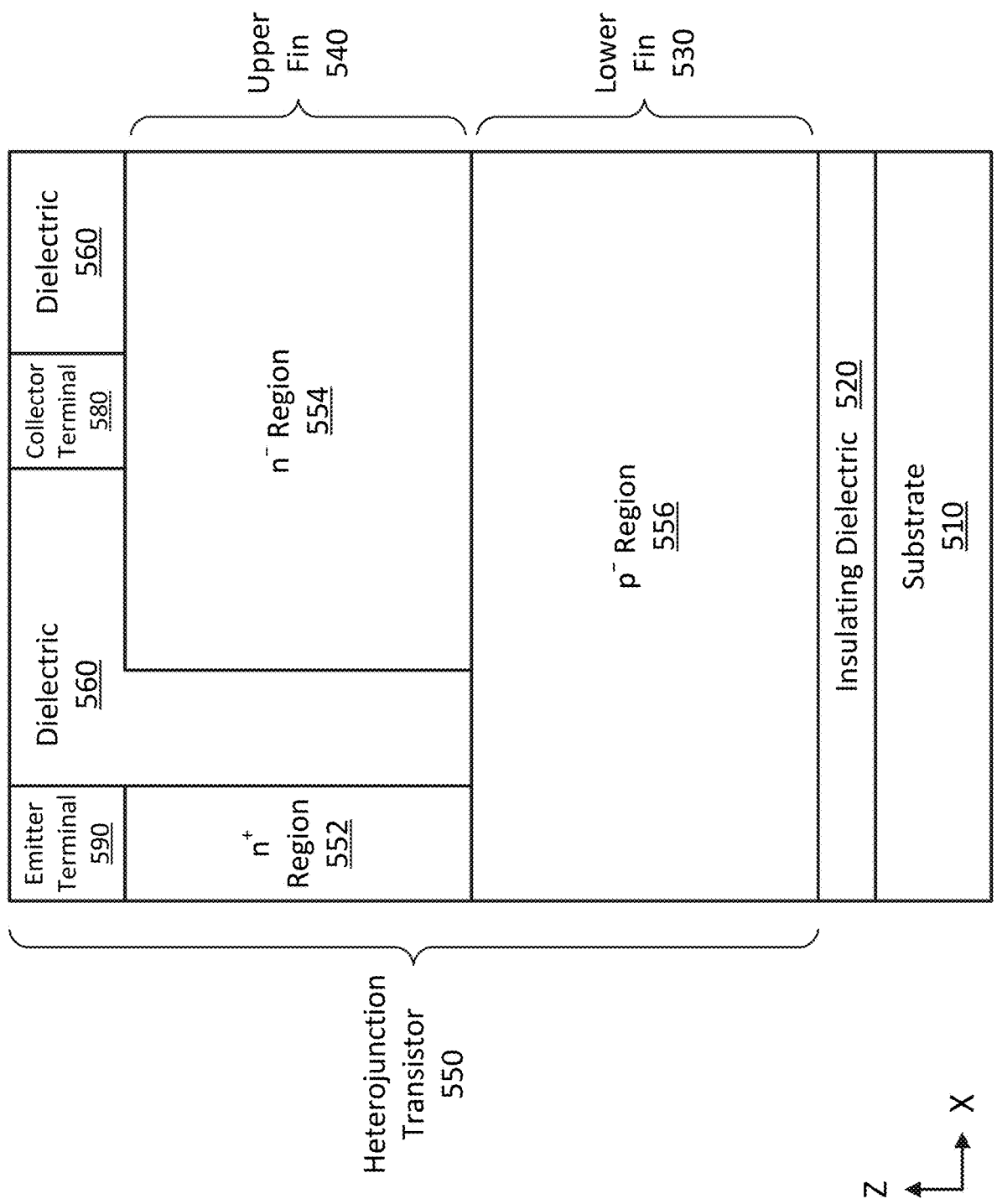

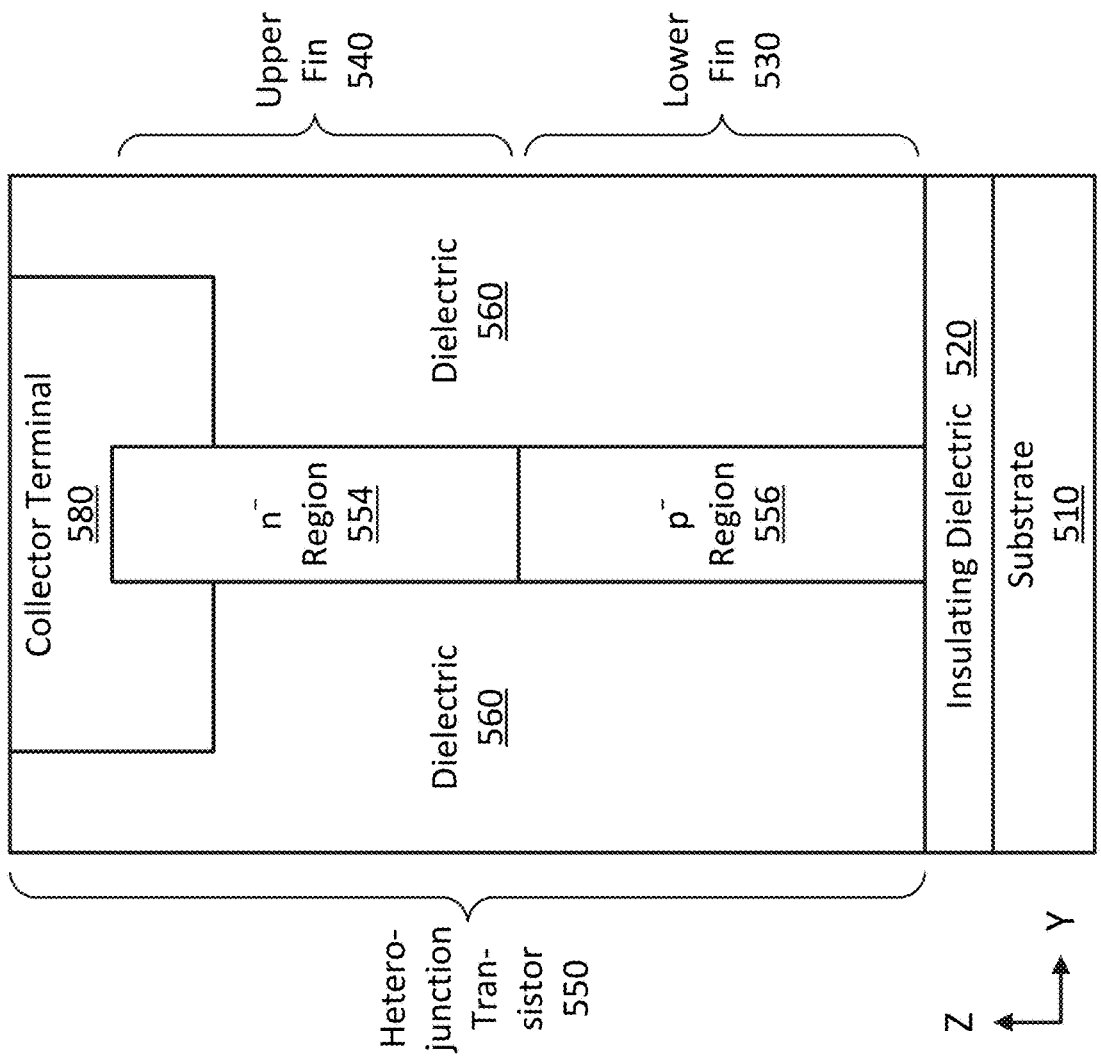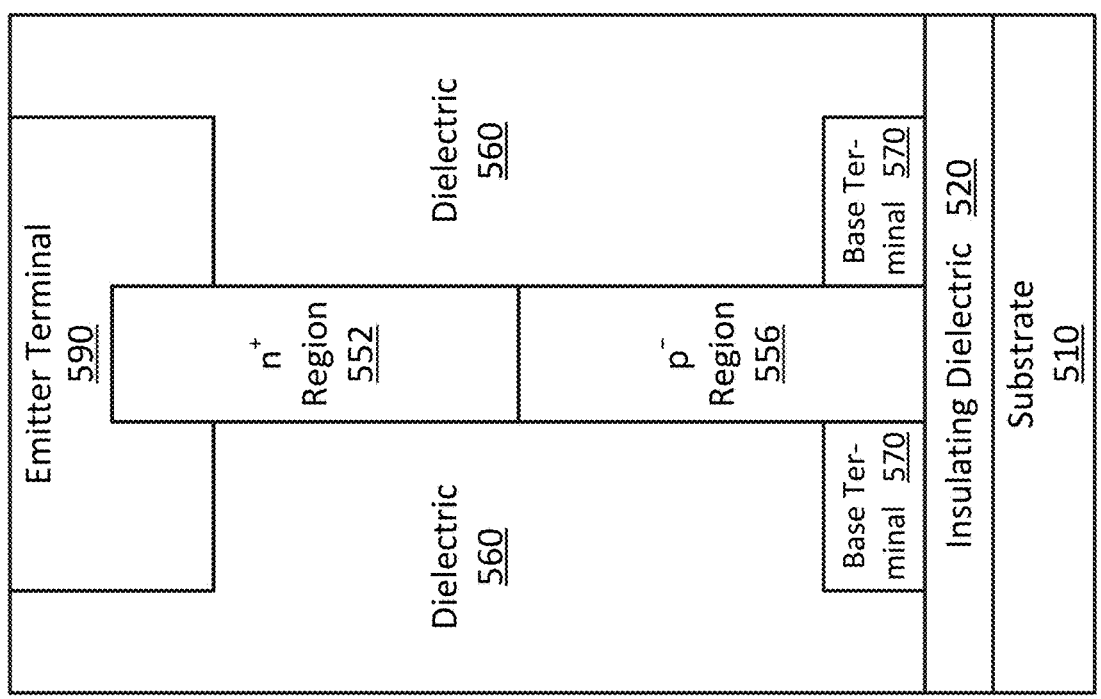

VERTICAL DIODE IN STACKED TRANSISTOR ARCHITECTURE

CROSS-REFERENCE TO RELATED APPLICATIONS

This patent application is a U.S. National Phase Application under 35 U.S.C. § 371 of International Application No. PCT/US2016/047605, filed on Aug. 18, 2016, the entire contents of which is hereby incorporated by reference herein.

BACKGROUND

Semiconductor fin structures are being used as alternatives to other approaches such as thin-film transistors (TFTs) for scaling semiconductor devices such as transistors into denser packages. There are a number of non-trivial performance issues associated with semiconductor fin structures.

BRIEF DESCRIPTION OF THE DRAWINGS

FIGS. 1A-1B are cross-sectional views of an example vertical diode and stacked transistor structure, according to an embodiment of the present disclosure.

FIGS. 2A-2C are cross-sectional views of an example vertical diode, according to another embodiment of the present disclosure.

FIG. 3 is a cross-sectional view of example multiple vertical diodes connected in parallel, according to an embodiment of the present disclosure.

FIGS. 4A-4F are cross-sectional views of example vertical diodes, according to other embodiments of the present disclosure.

FIGS. 5A-5C are cross-sectional views of an example heterojunction transistor, according to an embodiment of the present disclosure.

Figure 1B:
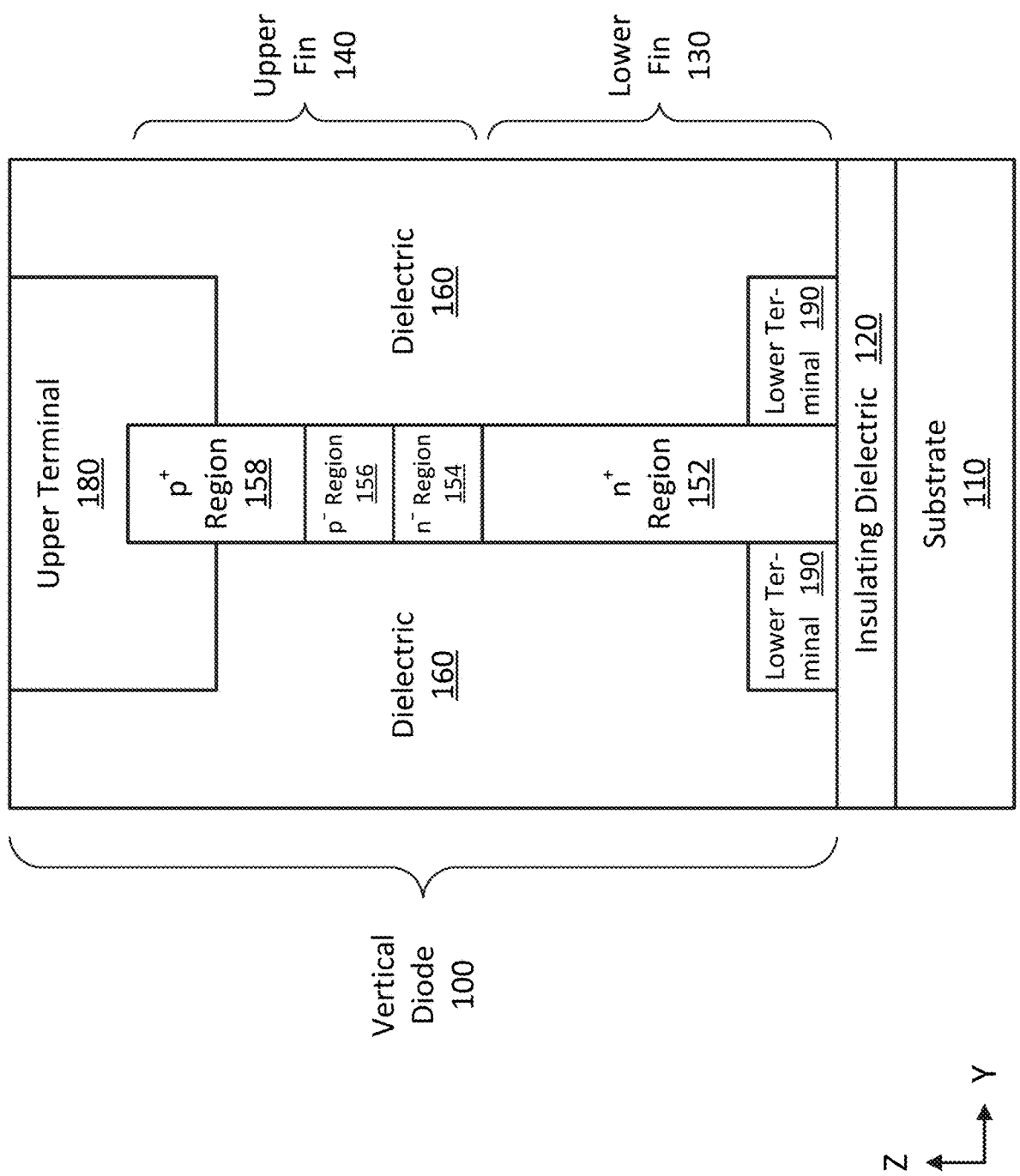

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

A stacked transistor structure is disclosed, the structure having one or more top transistors on a top portion of a semiconductor fin and one or more bottom transistors on a bottom portion of the semiconductor fin that is vertically aligned with the top portion of the semiconductor fin, according to an embodiment. The structure further includes a vertical diode integrated into the top and bottom portions of the semiconductor fin. The vertical diode is a useful device for applications such as complementary metal-oxide semiconductor (CMOS) logic integration, although any number of other applications and circuits can benefit from having diode functionality. The vertically aligned top and bottom portions of the semiconductor fin can be, for example, separate portions of the same semiconductor fin, separate top and bottom fins bonded together, or any combination of native fin structures and/or replacement fin structures, to name a few. A native fin structure is formed from an underlying substrate, while a replacement fin structure is distinct from the substrate. In some embodiments, the semiconductor materials in the top and bottom portions of the fin are different. In some such embodiments, the different materials meet to form a heterojunction vertical diode. In some embodiments, there are several such stacked fin arrangements, the various different fins being horizontally aligned. Note that a given stack may include any number of fin structures (two or more fin structures that are vertically aligned with one another in a so-called stacked arrangement). In some such embodiments, the vertical diodes are fabricated over two or more of these fins and connected in parallel to create higher capacity diodes, such as to provide sufficiently low resistance, or sufficient power or current capacity. Numerous other stacked device configurations will be apparent.

General Overview

Stacking transistors and other devices can increase the density (or area density) of such devices on an integrated circuit. However, as noted above, there are a number of non-trivial performance issues associated with such stacked device structures. For instance, semiconductor diodes, a useful component for many integrated circuit applications, are normally implemented in horizontal or single device layer configurations using approaches that fail to address issues associated with vertical integration and/or are not applicable or practical for vertical integration in stacked semiconductor fin structures effectively having two or more device layers.

Accordingly, techniques are provided herein for a vertical diode in a stacked device architecture. This allows, for example, integration of diodes with transistors and other devices in stacked device structures, such as for CMOS logic and input/output (I/O) integration, and for applications such as voltage regulation, electrostatic discharge (ESD) protection, and other diode applications. In various embodiments of the present disclosure, a single-fin vertical integration (where multiple device layers are formed on the same fin structure or simply "fin" for brevity) is provided to form a vertical diode structure for CMOS (or other technology, such as n-type MOS (NMOS) or p-type MOS (PMOS)) process. Here, top and bottom portions of the semiconductor fin can be used for transistors (e.g., stacked transistors, one layer of devices formed with the top portion of the semiconductor fin, another layer of devices with the bottom portion) in one region of the fin, and one or more vertical diodes in another region of the fin. Each vertical diode can be built on both the top and bottom portions of the fin, such as a p-doped portion and an n-doped portion. In some embodiments, the fin includes three or more device layers, with the vertical diode spanning two or more (and perhaps all) of these device layers.

The doping can be done in a variety of ways, such as via epitaxial growth with in situ doping, ion implantation, diffusion, or engineered fixed charge layers, to name a few. The doping can be light (e.g., on the order of one dopant atom per 100 million base semiconductor atoms), such as near a boundary or junction of the diode, or heavy (e.g., on the order of one dopant atom per 100 base semiconductor atoms), such as near an input or output terminal of the diode. The doping can also be heavier or lighter than these examples, and can be graded or stepped to produce more dopant densities or a continuum of dopant change (e.g., through epitaxial growth with varying dopant gas concentrations). In some embodiments, the p-doped portion of the diode meets the n-doped portion of the diode at a p-n junction. In some other embodiments, an intrinsic (e.g., undoped) portion of semiconductor separates the p-doped portion from the n-doped portion, to produce a p-i-n (or PIN) diode.

In some embodiments, the fin has different semiconductor materials for the top and bottom portions, and the vertical diode is a heterojunction diode. This can be useful for wide bandgap semiconductors, such as aluminum gallium nitride (AlGaN) and gallium nitride (GaN), which can produce better heterojunction devices. In other embodiments, the same (base) semiconductor material is used for the top and bottom portions of the fin, and the vertical diode is a homojunction diode. In some embodiments, multiple fins are horizontally arranged (e.g., in a laterally adjacent configuration), each fin having a vertical diode, with the vertical diodes connected in parallel to form a larger diode. The fin structure can be used to produce one layer of devices (e.g., transistors) in the bottom portion of the fin structure and a second layer of devices in the top portion of the fin structure. Note that the top and bottom portions of the fin structure are aligned with one another to provide an overall fin structure, but may be implemented with compositionally different semiconductor materials to effectively provide top and bottom semiconductor fins. Note also that the use of compositionally different materials may provide a heterojunction diode or transistor capability in one or more of the fins (particularly with wide bandgap semiconductor materials), as will be further explained below.

In some embodiments, the terminals or contacts of the vertical diode are at the top portion of the semiconductor fin. In some embodiments, the terminals are split, one terminal at the top portion, one terminal at the bottom portion of the semiconductor fin. In some multi-fin configurations (e.g., two, three, four, or more fins), separate vertical diodes have their corresponding terminals commonly connected to produce a larger diode. The terminals can be metal, conductive oxide, degenerate (heavily doped) semiconductor, or other conductive material, and can be vertically aligned (such as in corresponding locations to upper and lower transistor gate structures or terminals).

It should be noted that, throughout, terms such as "top" and "upper" as well as "bottom" and "lower" are used primarily for consistency and ease of description with the supplied drawings. However, the actual orientation during some of the fabrication or in some of the final products may differ between embodiments without departing from the scope of the present disclosure.

Materials that are "different" or "compositionally different" as used herein generally refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations.

In an example embodiment of the present disclosure, an integrated circuit (IC) structure is provided. The IC structure includes a semiconductor fin extending horizontally in a length direction. The semiconductor fin includes a bottom portion, and a top portion above the bottom portion. The IC structure further includes a bottom transistor associated with the bottom portion of the semiconductor fin, a top transistor above the bottom transistor and associated with the top portion of the semiconductor fin, and a vertical diode. The vertical diode includes a bottom region associated with at least the bottom portion of the semiconductor fin, with the bottom region including one of n-type and p-type dopant. The vertical diode also includes a top region associated with at least the top portion of the semiconductor fin, with the top region including the other of n-type and p-type dopant. The vertical diode further includes a bottom terminal electrically connected to the bottom region, and a top terminal electrically connected to the top region at the top portion of the semiconductor fin.

In another example embodiment of the present disclosure, an IC structure is provided. The IC structure includes first and second semiconductor fins extending horizontally in a length direction. Each semiconductor fin includes a bottom portion, and a top portion above the bottom portion. The IC structure further includes a bottom transistor associated with the bottom portion of the first semiconductor fin, a top transistor above the bottom transistor and associated with the top portion of the first semiconductor fin, and a vertical diode. The vertical diode includes a bottom region associated with at least the bottom portion of the second semiconductor fin, with the bottom region including one of n-type and p-type dopant. The vertical diode also includes a top region associated with at least the top portion of the second semiconductor fin, with the top region including the other of n-type and p-type dopant. The vertical diode further includes a bottom terminal electrically connected to the bottom region, and a top terminal electrically connected to the top region at the top portion of the second semiconductor fin.

Numerous other example embodiments and configurations will be apparent in light of this disclosure.

Architecture and Methodology

FIGS. 1A-1B are cross-sectional views of an example vertical diode 100 and stacked transistor structure (including upper transistor 145 and lower transistor 135), according to an embodiment of the present disclosure. In the stacked device architecture (or IC structure) of FIGS. 1A-1B, FIG. 1A is an X-Z view and FIG. 1B is a Y-Z view, where X, Y, and Z represent the length, width, and height dimensions of the underlying semiconductor fin (or fins) making up the stacked transistors. In more detail, FIG. 1A is a cross-sectional view through upper and lower fins 140 and 130 of the upper and lower transistors 145 and 135, respectively, while FIG. 1B is a cross-sectional view through upper and lower terminals 180 and 190 of the vertical diode 100. The upper and lower fins 140 and 130 are each electrically separated (or isolated) into two regions by dielectric material 160, to electrically isolate (or at least electrically isolate any direct connection) between the transistors (upper and lower transistors 145 and 135) and the vertical diode 100. The lower terminal can be routed, for example, to another device on the lower device layer, to another location by tunneling beneath the lower device layer, or back up to the top surface, depending on the application.

It should be noted that while most of the description herein is directed to stacked transistor structures having two device layers (e.g., an upper device layer and a lower device layer), some other embodiments of the present disclosure are directed to stacked transistor structures (and corresponding vertical diodes) of three or more device layers. For example, in some embodiments, there are three or more device layers (or fins) in a stacked transistor structure, where the vertical diode is formed among two or more contiguous such layers or fins. It should also be noted that while upper transistors (formed with the upper fin 140, such as upper transistor 145) would likely be electrically isolated from the lower transistors (formed on lower fin 130, such as lower transistor 135), for ease of illustration, these isolation layers or members (such as can be implemented from portions of the upper fin 140 or lower fin 130 or both) may not be illustrated or described in much further detail. Notwithstanding, in some embodiments, these isolation layers or members are formed from similar materials and doping as used to form similarly positioned layers in the corresponding vertical diodes.

Referring to FIGS. 1A-1B, semiconductor (e.g., semiconductor substrate) 110, such as silicon (Si), silicon germanium (SiGe), or a Group III-V semiconductor such as gallium arsenide (GaAs) is formed into vertical fins, such as lower fin 130 and upper fin 140 (that together can constitute one of the original semiconductor fins). At some point in the fabrication, one or both of the lower and upper fins 130 and 140 or their original structures may be replaced with a different fin structure using the original fin shape as a guide or template for forming the replacement fin or fins. For example, in some embodiments, the upper fin 140 includes replacement semiconductor fin material different than the semiconductor fin material of the lower fin 130. The substrate 110 is covered with a layer of insulating dielectric 120 (e.g., an oxide, nitride, or oxynitride of the semiconductor 110, or other electrically insulating material). The insulating dielectric 120 helps electrically isolate the devices from the substrate 110.

By way of example, the semiconductor fins can be formed through photolithography, epitaxial growth (such as aspect ratio trapping, or ART), or similar techniques, with corresponding trenches between (and defined by) adjacent fins. The fins, for example, can be made of the same semiconductor material as semiconductor substrate 110, and be of a uniform or consistent width or shape (e.g., rectangular, trapezoidal, to name a few). It is desired to use the fins to form a stacked transistor structure, with the lower portions 130 of the fins for one device (e.g., transistor) layer, the upper portions 140 for another device layer, and vertical diodes 100 spread across both upper and lower portions 140 and 130. The fin material can be replaced or grown as different materials, such as one or more nanowires stacked vertically in the original fin structure. Different materials can be used for the upper fin 140 versus the lower fin 130. One or both of the upper and lower fins 140 and 130 may be the same semiconductor material as the semiconductor substrate 110. In some embodiments, a common semiconductor fin is used for the upper and lower fins 140 and 130. In some embodiments, a common semiconductor fin is used to form the upper and lower fins 140 and 130, the semiconductor fin possibly serving as a template for replacement fin material (e.g., epitaxially grown replacement fin material) to form one or both of the upper and lower fins 140 and 130.

For example, silicon (Si) can be used for one of the upper and lower fins 140 and 130, and silicon germanium (SiGe) for the other. In some other embodiments, Si and gallium arsenide (GaAs) can make up the upper and lower fins 140 and 130 (in some order). In one or more embodiments, Si and a Group III-V semiconductor (e.g., a compound including a Group III element such as boron, aluminum, gallium, and indium together with a Group V element such as nitrogen, phosphorus, arsenic, antimony, and bismuth) make up the upper and lower fins 140 and 130 (in some order). In some embodiments, Si and Ge make up the upper and lower fins 140 and 130 (in some order). The substrate 110 can be one of the materials making up the upper and lower fins 140 and 130, or another material (such as another semiconductor material).

By way of further example, vertical heterojunction diodes can be formed from upper and lower fins 140 and 130 whose semiconductor materials have wide bandgaps, such as aluminum gallium nitride (AlGaN) for one portion (lower or upper) of the fin and GaN for the other portion. In some other embodiments, different materials for upper and lower fins 140 and 130 are used, such as aluminum gallium arsenide (AlGaAs) for a p-type portion (lower or upper) of the fin and GaAs for a corresponding n-type portion. In still other embodiments, different combinations of materials for the upper and lower fins 140 and 130 are possible (in any order), such as GaAs and indium GaAs (InGaAs), or indium aluminum GaAs (InAlGaAs) and GaAs, to name a few.

By way of still further example, vertical homojunction diodes can be formed from upper and lower fins 140 and 130 having the same base semiconductor materials, but different degrees and types of doping. For instance, Si can be used with different dopants (e.g., boron (B) for p-type doping, phosphorus (P), As, and antimony (Sb) for n-type doping) and different doping concentrations (e.g., boron to $1 \times 10^{19}$ or greater per cubic centimeter (cc) for highly doped, or to $1 \times 10^{18}$ or less per cc for lightly doped). Throughout, highly or lightly doped can be indicated with a superscript + or −, as in $p^+$ for highly doped p-type doping, $p^-$ for lightly doped p-type doping, $n^+$ for highly doped n-type doping, and $n^-$ for lightly doped n-type doping. Other example semiconductors for homojunction diodes include AlGaN and GaN.

The upper and lower fins 140 and 130 can be used to form device layers, such as for transistors. For example, a gate structure (or upper gate structure) 170 (e.g., a gate dielectric, such as a high-κ dielectric like hafnium dioxide (e.g., $HfO_2$) and a gate electrode, such as one or more of a metal, conductive oxide, heavily doped semiconductor, and the like) can be formed over the upper fin 140 (and similarly for the lower fin 130 (e.g., the upper and lower gate structures can be vertically aligned) to control corresponding upper and lower transistors 145 and 135. For instance, the gate structure 170 controls the upper transistor 145 by applying a gate voltage to a semiconductive upper channel region 142 (e.g., a portion or region of the upper fin 140 that coincides with the gate structure 170, also called an upper body region 142) of the upper transistor 145. The upper channel region 142 electrically connects upper source 144 and drain 146 regions (e.g., highly doped semiconductor regions adjacent to and on opposites sides of the channel region 142) of the upper transistor 145 in response to the applied gate electrode voltage. The upper source 144 and drain 146 regions can be, for example, heavily doped regions of the upper fin 140. For instance, n-type source and drain regions can be semiconductor material heavily doped with n-type dopant, while p-type source and drain regions can be semiconductor material heavily doped with p-type dopant. In some embodiments, the source and drain regions are replacement semiconductor material, such as epitaxially formed source and drain regions with in situ doping.

In a similar fashion, transistors, such as lower transistor 135, can be formed with the lower fin 130, and further transistors can be formed with the upper fin 140. For example, the lower transistor 135 associated with the lower fin 130 includes lower channel (or body) region 132 together with lower source 134 and drain 136 regions electrically connected by the lower channel 132. As such, each region of the lower fin 130 can be associated with one or more transistors vertically aligned (e.g., channel regions or gate structures are vertically aligned) with a corresponding one or more transistors associated with the upper fin 140.

On the same or different fins (e.g., similarly fabricated fins in horizontal alignment with the upper and lower fins 140 and 130), vertical diodes 100 are formed. These are vertical devices, which for ease of illustration and description, are usually shown with their cathode (e.g., corresponding to p-doped side or end) terminal as upper terminal 180, and their anode (e.g., corresponding to n-doped side or end) terminal as lower terminal 190. In some embodiments, the upper and lower terminals 180 and 190 are vertically aligned (or in-line), such as at locations corresponding to gate structures of stacked transistors. In other embodiments, the locations of the cathode and anode terminals are reversed. The upper and lower terminals 180 and 190 can be any conductive material, such as metal, conductive oxide, degenerate (e.g., heavily doped) semiconductor, or the like.

In operation, as illustrated in FIGS. 1A-1B, a positive voltage applied to the upper terminal 180 with respect to the lower terminal 190 causes a flow of current from the upper terminal 180 to the lower terminal 190, traversing a series (in this case, four) of regions, such as $p^+$ region 158, $p^-$ region 156, $n^-$ region 154, and $n^+$ region 152, in the process. The first region or regions are p-doped, and the last region or regions are n-doped, with the doping concentrations being greatest near the upper and lower terminals 180 and 190, and being least near the boundary (such as a p-n junction) between the p-doped regions and the n-doped regions.

In further detail, as illustrated in FIGS. 1A-1B, upper fin 140 includes $p^+$ region 158 coupled to (e.g., electrically connected to) the upper terminal 180, $p^-$ region 156 adjacent to $p^+$ region 158, and $n^-$ region 154 adjacent to (and forming a p-n junction with) $p^-$ region 156. For instance, upper fin 140 can be made of Si, doped to different types and dopant levels to produce $p^+$ region 158, $p^-$ region 156, and $n^-$ region 154, and the p-n junction is a homojunction. In addition, lower fin 130 includes $n^+$ region 152 adjacent to $n^-$ region 154 and electrically connected to lower terminal 190. Doping can be from a variety of techniques, such as diffusion, ion implantation, epitaxial growth, or engineered fixed charge layers, to mention some example doping techniques. Remaining portions of the IC structure of FIG. 1A are filled with dielectric material 160 to, for example, promote device integrity, isolate the separate devices, and the like.

The upper transistor 145 of the stacked transistor structure of FIG. 1A is usually electrically isolated from (or not in direct contact with) the lower transistor 135. By way of example, insulating dielectric layers such as silicon dioxide ($SiO_2$) can separate lower gate electrodes from upper gate electrodes (e.g., when it is desired to drive the corresponding upper and lower transistors 145 and 135 with different signals). In addition, isolation layers between the lower and upper fins 130 and 140 can electrically separate the lower and upper transistors 135 and 145 (such as the source and drain regions 134 and 136 of the lower transistor 135 from the source and drain regions 144 and 146 of the upper transistor 145). The isolation layers can separate the source and drain regions associated with the lower fin 130 from those associated with the upper fin 140. These isolation layers can correspond to the semiconductor fin (e.g., formed originally from the same tall semiconductor fin), such as between and vertically aligned with the lower fin 130 and upper fin 140.

For example, the isolation layers can be doped semiconductor, such as the same or similar doped semiconductor layers used to form the vertical diode 100. For instance, if the upper transistor 145 is an NMOS device, then an isolation layer adjacent to the upper fin 140 can be p-doped semiconductor, and if the upper transistor 145 is a PMOS device, then this isolation layer can be n-doped semiconductor. Likewise, if the lower transistor 135 is an NMOS device, then an isolation layer adjacent to the lower fin 130 can be p-doped semiconductor, and if the lower transistor 135 is a PMOS device, then this isolation layer can be n-doped semiconductor. In some embodiments, the isolation layers are formed through oxidation or removal of a portion of the fin between the lower and upper fins 130 and 140. In some embodiments, the isolation layers are formed through fixed charge layers adjacent to the fin (such as fixed charge layers adjacent to the isolation layers). Remaining spaces can be filled with further insulating dielectric 160 such as $SiO_2$.

FIGS. 2A-2C are cross-sectional views of an example vertical diode 200, according to another embodiment of the present disclosure. FIG. 2A is a cross-sectional (X-Z) view through lower and upper fins 230 and 240. FIGS. 2B and 2C are cross-sectional (Y-Z) views through lower and upper terminals 290 and 280, respectively. Parts of the vertical diode 200 of FIGS. 2A-2C are similar to the same named (and similarly numbered) parts of the vertical diode 100 of FIGS. 1A-1B, such as substrate 210, insulating dielectric 220, lower fin 230, upper fin 240, $n^-$ region 254, $p^-$ region 256, $p^+$ region 258, dielectric 260, and upper terminal 280. In contrast to the vertical diode 100, though, the vertical diode 200 has a lower (anode) terminal 290 at the top of the structure, similar to the upper terminal 280. This is accomplished with an $n^+$ region 252 that extends horizontally and then vertically (e.g., L-shaped), repurposing the upper fin 240 to provide the $n^+$ region 252 at one portion of the vertical diode 200, and the $n^-$ region 254, $p^-$ region 256, $p^+$ region 258 at another portion of the vertical diode, both portions (directly) electrically insulated from each other through the dielectric material 260, but (indirectly) electrically connected to each other through the $n^+$ region 252 of the lower fin 230.

The vertical diode 200 thus works vertically but routes both input and output through terminals at the top of the vertical diode 200. In an example embodiment, the vertical diode uses a homojunction structure, such as Si upper and lower fins 330, with appropriate doping to produce the types of concentrations in the different layers, with the upper fin 240 being doped in two different patterns (e.g., the stepped $n^-/p^-/p^+$ regions for the upper terminal 280 connection, and the uniform $n^+$ region for the lower terminal 290 connection).

FIG. 3 is a cross-sectional view of example multiple vertical diodes 300 connected in parallel, according to an embodiment of the present disclosure. FIG. 3 shows two semiconductor fins, including first semiconductor fin 335 and second semiconductor fin 345 (each semiconductor fin having an upper fin 340 and a lower fin 330), for implementing two corresponding vertical diodes 300. Each vertical diode 300 has a structure similar to the vertical diode 100 of FIGS. 1A-1B, the first vertical diode (on first semiconductor fin 335) including p$^+$ region 357, p$^-$ region 355, n$^-$ region 353, and n$^+$ region 351, and the second vertical diode (on second semiconductor fin 345) including p$^+$ region 358, p$^-$ region 356, n$^-$ region 354, and n$^+$ region 352. The vertical diodes 300 are fabricated on semiconductor substrate 310 and insulating dielectric 320, with spaces filled by dielectric material 360. The two p$^+$ regions 357 and 358 are commonly coupled to an upper terminal 380, while the two n$^+$ regions 351 and 352 are commonly coupled to a lower terminal 390.

While FIG. 3 shows two such vertical diodes 300 connected in parallel, in other embodiments of the present disclosure, three or more vertical diodes 300 are connected in parallel. In addition, factors such as the length of the vertical diodes 300 (in the horizontal or fin length dimension) can also be varied to produce vertical diodes 300 (or parallel coupled vertical diodes 300) having the desired electrical properties.

FIGS. 4A-4F are cross-sectional (X-Z) views of six example vertical diodes 400, 401, 402, 403, 404, and 405, according to other embodiments of the present disclosure. Parts of the vertical diodes 400-405 of FIGS. 4A-4F are similar to the same named (and similarly numbered) parts of the vertical diodes 100-300 of FIGS. 1A-3, such as substrate 410, insulating dielectric 420, lower fin 430, upper fin 440, dielectric 460, and upper terminal 480. Accordingly, repeated description of aspects of these elements may be omitted so that attention can be directed to the significant differences of the vertical diodes 400-405 from those described earlier. In particular, description will be directed primarily to the doping layers or structures such as n$^+$ region 452, n$^-$ region 454, p$^-$ region 456, p$^+$ region 458, and the like, with other aspects being assumed to resemble the embodiment of the vertical diode 100 of FIGS. 1A-1C unless otherwise stated.

In the vertical diode 400 of FIG. 4A, the p-doped regions p$^-$ region 456 and p$^+$ region 458 are part of the upper fin 440 while the n-doped regions n$^+$ region 452 and n$^-$ region 454 are part of the lower fin 430. For example, the upper fin 440 may include a semiconductor material that is amenable to p-type doping while the lower fin 430 may include a different semiconductor material that is amenable to n-type doping, with the boundary between the two different semiconductor materials forming a heterojunction. It should be noted that in this and the other disclosed embodiments, the order the doping layers (and corresponding diode terminals) can be reversed.

In the vertical diode 401 of FIG. 4B, the doping layers do not form a set of discrete layers, rather doping is a continuum from the heavily p-doped p$^+$ region 458 to the heavily n-doped n$^+$ region 452 (transitioning to lightly p-doped p$^-$ region 456, then a p-n junction, then lightly n-doped n$^-$ region 454 in the process). For example, the doped regions could be formed through epitaxial growth (such as in situ doping), with different concentrations of the different dopants used to form the continuum for doping levels and doping types. In other embodiments, some of the doping layers are formed as continuums of varying doping levels while others of the doping layers are formed as fixed doping levels.

In the vertical diode 402 of FIG. 4C, GaN is the base semiconductor used to form a homojunction vertical diode. As GaN is more amenable to n-type doping than p-type doping, there are only three doping regions used to implement the vertical diode 402, namely n$^+$ GaN region 452, n$^-$ GaN region 454, and p$^-$ GaN region 456. In other embodiments of the present disclosure, the number of doping regions can vary, and the boundaries between the regions can vary from distinct (e.g., discrete doping layers) to blurred (e.g., continuum doping layers). The doping regions do include a p-type doped region near the cathode terminal and an n-type doped region near the anode terminal.

In the vertical diode 403 of FIG. 4D, only two doped regions are present in this heterojunction vertical diode, in this case a p-type AlGaAs region 457 and an n-type GaAs region 453. These semiconductor materials have wide band gaps, which can produce more effective heterojunction vertical diodes.

In the vertical diode 404 of FIG. 4E, there are two doped regions, namely n$^+$ region 452 and p$^+$ region 458, separated by an undoped (intrinsic) semiconductor region 455. This is an example of a p-i-n (PIN) vertical diode. Unlike some other embodiments, it lacks a p-n junction.

In the vertical diode 405, the n$^+$ region 452 has been replaced (or augmented) with a set of three stepped regions of increasing doping concentration, namely (normal) heavily doped n$^+$ region 452, more heavily doped n$^{++}$ region 451, and still more heavily doped n$^{+++}$ region 450. For example, the n$^+$ region 452 could be doped to $1\times10^{19}$ per cc dopant concentration, the n$^{++}$ region 451 could be doped to $5\times10^{19}$ per cc dopant concentration, and the n$^{+++}$ region 450 could be doped to $1\times10^{20}$ per cc dopant concentration.

FIGS. 5A-5C are cross-sectional views of an example heterojunction transistor 550, according to an embodiment of the present disclosure. FIG. 5A is a cross-sectional (X-Z) view through lower and upper fins 530 and 540. FIGS. 5B and 5C are cross-sectional (Y-Z) views through emitter terminal 590 and collector terminal 580, respectively. Parts of the heterojunction transistor 550 of FIGS. 5A-5C are similar to the same named (and similarly numbered) parts of the vertical diode 100 of FIGS. 1A-1B, such as substrate 510, insulating dielectric 520, lower fin 530, upper fin 540, and dielectric 560. However, heterojunction transistor 550 is an example of an NPN vertical bipolar junction transistor that uses two heterojunction vertical diodes as components.

In further detail, the heterojunction transistor 550 includes an emitter terminal 590 for supplying electrons through a narrow n$^+$ region 552. The supplied electrons traverse a relatively short distance (as minority carriers) through p$^-$ region 556 (under control of base terminal 570) and out collector terminal 580 via a wide n$^-$ region 554. As such, current flows from the collector terminal 580 to the emitter terminal 590 as controlled by the base terminal 570 to function as a transistor (such as an amplifying transistor). The upper fin 540 is one semiconductor material (amenable to n-type doping) while the lower fin 530 is another semiconductor material (amenable to p-type doping) to create a heterojunction transistor, with the collector terminal 580, n$^-$ region 554, p$^-$ region 556, and base terminal 570 forming one vertical heterojunction diode, and the emitter terminal 590, n$^+$ region 552, p$^-$ region 556, and base terminal 570 forming a second vertical heterojunction diode (as illustrated more clearly in FIGS. 5B-5C). The choice of, for example, semiconductor materials (e.g., bandgaps), dopant materials, dopant concentrations, feature widths, and the like can be varied to adjust the performance characteristics of the heterojunction transistor 550.

Figure 6:
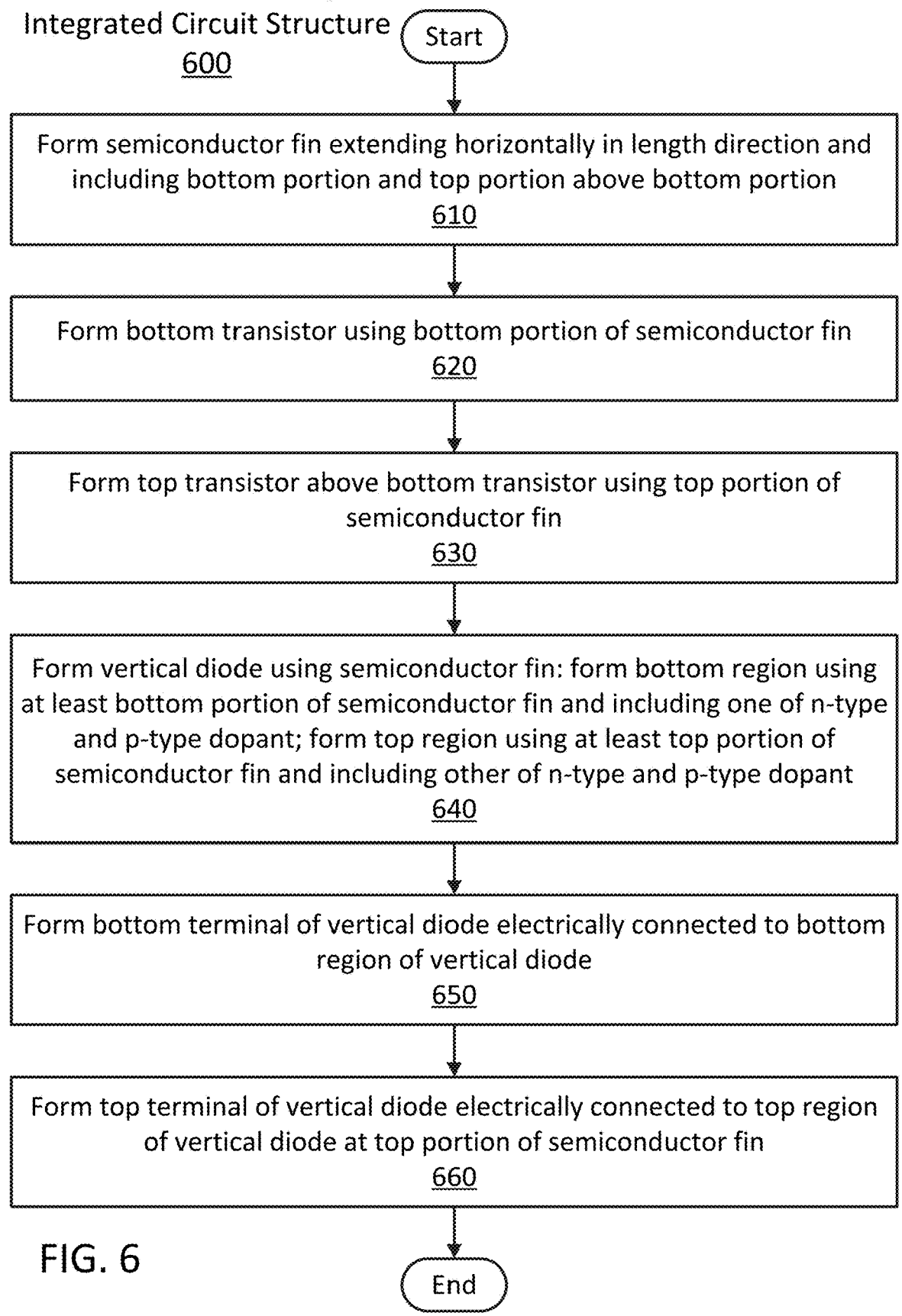
FIGS. 6-7 are flow diagrams of example methods of fabricating integrated circuit structures, according to embodiments of the present disclosure.
Figure 7:
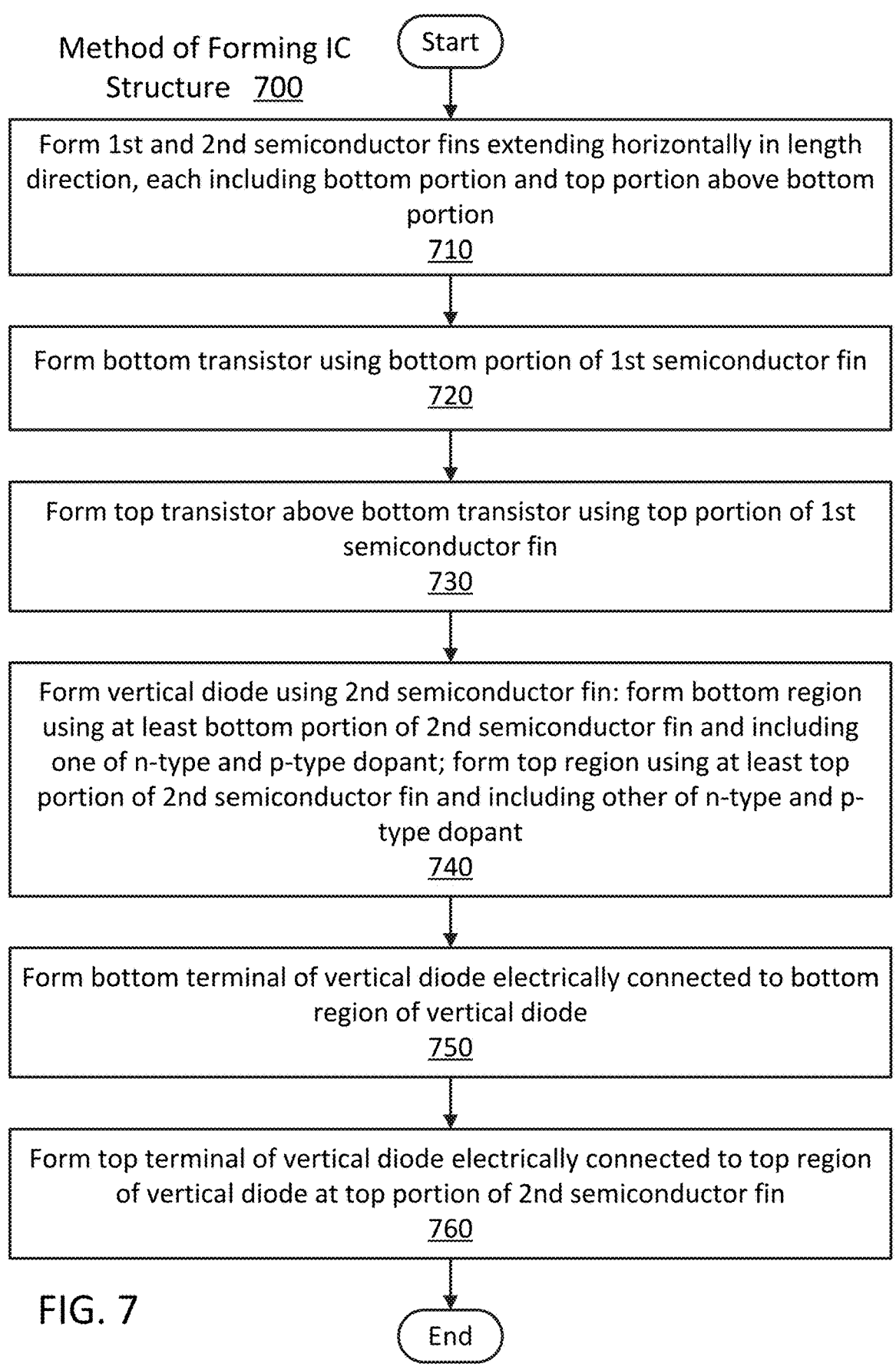

FIGS. 6-7 are flow diagrams of example methods 600-700 of fabricating integrated circuit (IC) structures, according to embodiments of the present disclosure. These and other methods disclosed herein may be carried out using integrated circuit fabrication techniques such as photolithography as would be apparent in light of the present disclosure. The corresponding transistors, diodes, and other devices may be part of other (logic) devices on the same substrate, such as application specific integrated circuits (ASICs), microprocessors, central processing units, processing cores, and the like. Unless otherwise described herein, verbs such as "coupled" or "couple" refer to an electrical coupling (such as capable of transmitting an electrical signal, or electrically conductive), either directly or indirectly (such as through one or more conductive layers in between).

Referring to the method 600 of FIG. 6 (with specific example references to the structures of FIGS. 1A-5C), processing begins with forming 610 a semiconductor fin extending horizontally in a length (such as X-axis) direction, the semiconductor fin including a bottom portion (such as lower fin 130), and a top portion (such as upper fin 140) above the bottom portion. The method 600 further includes forming 620 a bottom transistor (such as lower transistor 135) using the bottom portion of the semiconductor fin, forming 630 a top transistor (such as upper transistor 145) above the bottom transistor using the top portion of the semiconductor fin, and forming 640 a vertical diode (such as vertical diode 100) using the semiconductor fin.

The forming 640 of the vertical diode includes forming a bottom region (such as $n^+$ region 152) using at least the bottom portion of the semiconductor fin, the bottom region including one of n-type and p-type dopant. The forming 640 of the vertical diode further includes forming a top region (such as $p^+$ region 158 and $p^-$ region 156) using at least the top portion of the semiconductor fin, the top region including the other of n-type and p-type dopant. The method 600 further includes forming 650 a bottom terminal (such as lower terminal 190) electrically connected to the bottom region, and forming 660 a top terminal (such as upper terminal 180) electrically connected to the top region at the top portion of the semiconductor fin.

Referring to the method 700 of FIG. 7, processing begins with forming 710 first and second semiconductor fins (such as first and second semiconductor fins 335 and 345) extending horizontally in a length direction, each semiconductor fin including a bottom portion, and a top portion above the bottom portion. The method 700 further includes forming 720 a bottom transistor using the bottom portion of the first semiconductor fin, forming 730 a top transistor above the bottom transistor using the top portion of the first semiconductor fin, and forming 740 a vertical diode using the second semiconductor fin. The forming 740 of the vertical diode includes forming a bottom region using at least the bottom portion of the second semiconductor fin, the bottom region including one of n-type and p-type dopant. The forming 740 of the vertical diode further includes forming a top region using at least the top portion of the second semiconductor fin, the top region including the other of n-type and p-type dopant. The method 700 further includes forming 750 a bottom terminal electrically connected to the bottom region, and forming 760 a top terminal electrically connected to the top region at the top portion of the second semiconductor fin.

While the above example methods appear as a series of operations or stages, it is to be understood that there is no required order to the operations or stages unless specifically indicated.

Example System

Figure 8:
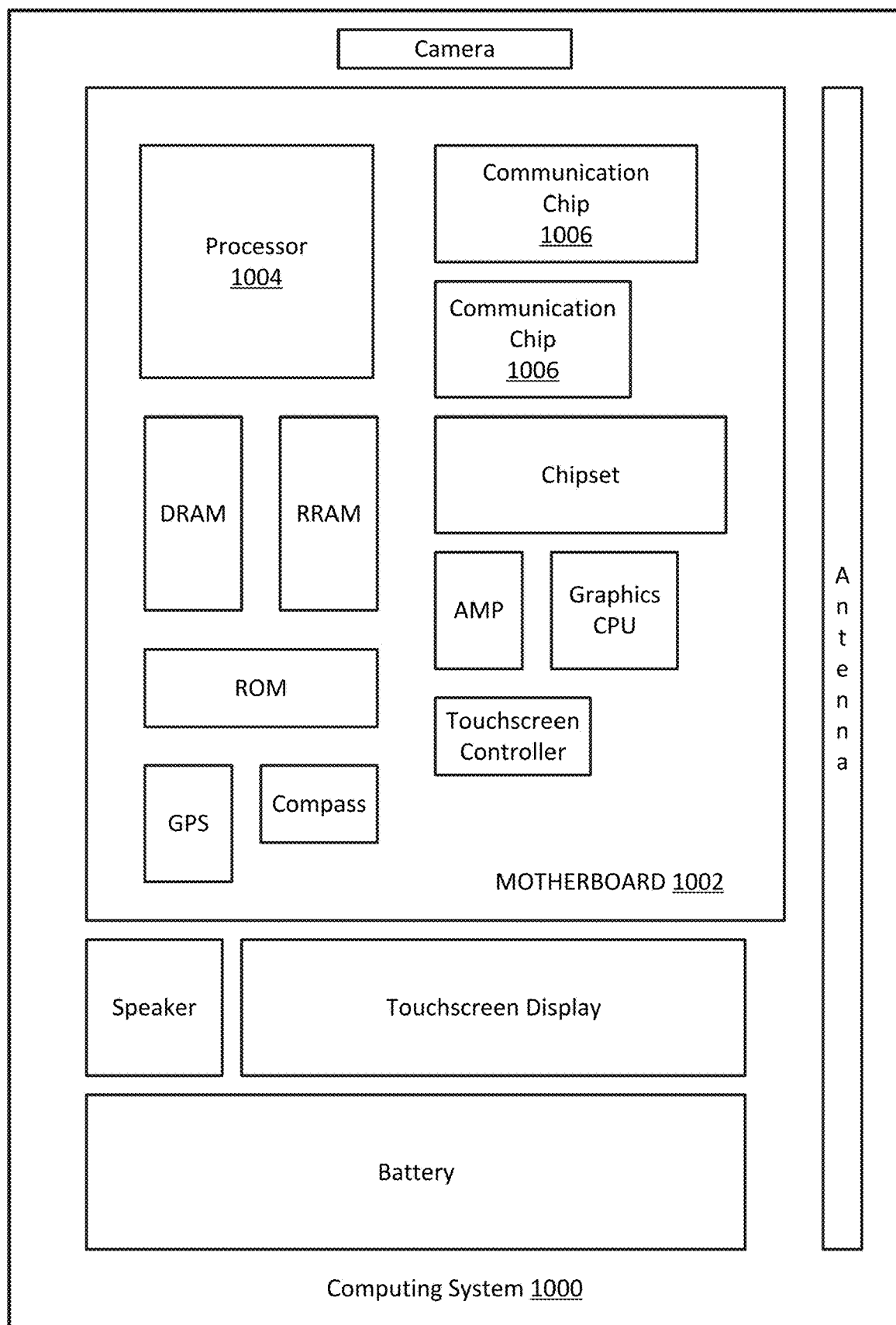
FIG. 8 illustrates an example computing system implemented with the integrated circuit structures or techniques disclosed herein, according to an embodiment of the present disclosure.

FIG. 8 illustrates an example computing system 1000 implemented with the integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including stacked transistor structures and vertical diodes as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., DRAM), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more stacked transistor structures and vertical diodes) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like, that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., stacked transistor structures and vertical diodes) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., stacked transistor structures and vertical diodes) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., stacked transistor structures and vertical diodes) formed using the disclosed techniques, as variously described herein.

Further Example Embodiments

The following examples pertain to further embodiments, from which numerous permutations and configurations will be apparent.

Example 1 is an integrated circuit (IC) structure including: a semiconductor fin extending horizontally in a length direction, the semiconductor fin including a bottom portion, and a top portion above the bottom portion; a bottom transistor associated with the bottom portion of the semiconductor fin; a top transistor above the bottom transistor and associated with the top portion of the semiconductor fin; and a vertical diode including a bottom region associated with at least the bottom portion of the semiconductor fin, the bottom region including one of n-type and p-type dopant, a top region associated with at least the top portion of the semiconductor fin, the top region including the other of n-type and p-type dopant, a bottom terminal electrically connected to the bottom region, and a top terminal electrically connected to the top region at the top portion of the semiconductor fin.

Example 2 includes the IC structure of Example 1, where the semiconductor fin is a first semiconductor fin, the vertical diode is a first vertical diode, and the IC structure further includes: a second semiconductor fin extending horizontally in the length direction, the second semiconductor fin including a bottom portion, and a top portion above the bottom portion; and a second vertical diode including a bottom region associated with at least the bottom portion of the second semiconductor fin, the bottom region including the one of n-type and p-type dopant, a top region associated with at least the top portion of the second semiconductor fin, the top region including the other of n-type and p-type dopant, a bottom terminal electrically connected to the bottom region, and a top terminal electrically connected to the top region at the top portion of the second semiconductor fin, and where the top and bottom terminals of the second vertical diode are electrically connected to the top and bottom terminals, respectively, of the first vertical diode to electrically connect the first and second vertical diodes in parallel.

Example 3 includes the IC structure of any of Examples 1-2, where for the vertical diode, the bottom region is below the top region, the bottom terminal is below the top terminal, and the bottom terminal is electrically connected to the bottom region at the bottom portion of the semiconductor fin.

Example 4 includes the IC structure of Example 3, where the top and bottom terminals of the vertical diode are vertically aligned.

Example 5 includes the IC structure of any of Examples 1-2, where the vertical diode further includes a second top region associated with at least the top portion of the semiconductor fin, and where for the vertical diode, the second top region includes the one of n-type and p-type dopant, the bottom region is below the top and second top regions, and the bottom terminal is further electrically connected to the second top region at the top portion of the semiconductor fin.

Example 6 includes the IC structure of Example 5, where the vertical diode further includes an insulation region between and electrically separating the top and second top regions within the top portion of the semiconductor fin.

Example 7 includes the IC structure of any of Examples 5-6, where the top and bottom terminals of the vertical diode are horizontally aligned.

Example 8 includes the IC structure of any of Examples 1-7, where the top and bottom regions of the vertical diode meet to form a p-n junction.

Example 9 includes the IC structure of any of Examples 1-8, where the top transistor is one of an n-type metal oxide semiconductor (NMOS) transistor and a p-type MOS (PMOS) transistor, the bottom transistor is the other of the NMOS transistor and the PMOS transistor, and the top and bottom transistors make up a complementary MOS (CMOS) transistor structure.

Example 10 includes the IC structure of Example 9, where when the top transistor is the NMOS transistor, the top region of the semiconductor fin includes the n-type dopant, and when the top transistor is the PMOS transistor, the top region of the semiconductor fin includes the p-type dopant.

Example 11 includes the IC structure of any of Examples 1-10, where the top portion of the semiconductor fin includes a first semiconductor material, and the bottom portion includes a second semiconductor material different than the first semiconductor material.

Example 12 includes the IC structure of Example 11, where the top and bottom portions of the semiconductor fin meet to form a heterojunction, and the vertical diode is a heterojunction diode.

Example 13 includes the IC structure of Example 12, where the heterojunction diode is a first heterojunction diode, the IC structure further including a second heterojunction diode sharing a common said bottom portion of the semiconductor fin with the first heterojunction diode, the first and second heterojunction diodes together making up a heterojunction transistor.

Example 14 includes the IC structure of any of Examples 1-13, where the bottom transistor includes bottom source and drain regions, and a semiconductor region of the bottom portion of the semiconductor fin adjacent to and connecting the bottom source and drain regions, the top transistor includes top source and drain regions, and a semiconductor region of the top portion of the semiconductor fin adjacent to and connecting the top source and drain regions, and the semiconductor regions of the top and bottom portions of the semiconductor fin are vertically aligned.

Example 15 includes the IC structure of Example 14, where the bottom transistor further includes a bottom gate structure on the semiconductor region of the bottom portion of the semiconductor fin, the top transistor further includes a top gate structure on the semiconductor region of the top portion of the semiconductor fin, and the top and bottom gate structures are vertically aligned.

Example 16 is an integrated circuit (IC) structure including: first and second semiconductor fins extending horizontally in a length direction, each semiconductor fin including a bottom portion, and a top portion above the bottom portion; a bottom transistor associated with the bottom portion of the first semiconductor fin; a top transistor above the bottom transistor and associated with the top portion of the first semiconductor fin; and a vertical diode including a bottom region associated with at least the bottom portion of the second semiconductor fin, the bottom region including one of n-type and p-type dopant, a top region associated with at least the top portion of the second semiconductor fin, the top region including the other of n-type and p-type dopant, a bottom terminal electrically connected to the bottom region, and a top terminal electrically connected to the top region at the top portion of the second semiconductor fin.

Example 17 includes the IC structure of Example 16, where the vertical diode is a first vertical diode, the IC structure further including: a third semiconductor fin extending horizontally in the length direction, the third semiconductor fin including a bottom portion, and a top portion above the bottom portion; and a second vertical diode including a bottom region associated with at least the bottom portion of the third semiconductor fin, the bottom region including the one of n-type and p-type dopant, a top region associated with at least the top portion of the third semiconductor fin, the top region including the other of n-type and p-type dopant, a bottom terminal electrically connected to the bottom region, and a top terminal electrically connected to the top region at the top portion of the third semiconductor fin, where the top and bottom terminals of the second vertical diode are electrically connected to the top and bottom terminals, respectively, of the first vertical diode to electrically connect the first and second vertical diodes in parallel.

Example 18 includes the IC structure of any of Examples 16-17, where for the vertical diode, the bottom region is below the top region, the bottom terminal is below the top terminal, and the bottom terminal is electrically connected to the bottom region at the bottom portion of the second semiconductor fin.

Example 19 includes the IC structure of Example 18, where the top and bottom terminals of the vertical diode are vertically aligned.

Example 20 includes the IC structure of any of Examples 16-17, where the vertical diode further includes a second top region associated with at least the top portion of the second semiconductor fin, and where for the vertical diode, the second top region includes the one of n-type and p-type dopant, the bottom region is below the top and second top regions, and the bottom terminal is further electrically connected to the second top region at the top portion of the second semiconductor fin.

Example 21 includes the IC structure of Example 20, where the vertical diode further includes an insulation region between and electrically separating the top and second top regions within the top portion of the second semiconductor fin.

Example 22 includes the IC structure of any of Examples 20-21, where the top and bottom terminals of the vertical diode are horizontally aligned.

Example 23 includes the IC structure of any of Examples 16-22, where the top transistor is one of an n-type metal oxide semiconductor (NMOS) transistor and a p-type MOS (PMOS) transistor, the bottom transistor is the other of the NMOS transistor and the PMOS transistor, and the top and bottom transistors make up a complementary MOS (CMOS) transistor structure.

Example 24 includes the IC structure of Example 23, where when the top transistor is the NMOS transistor, the top regions of the first and second semiconductor fins include the n-type dopant, and when the top transistor is the PMOS transistor, the top regions of the first and second semiconductor fins include the p-type dopant.

Example 25 includes the IC structure of Example 24, where when the top transistor is the NMOS transistor, the bottom region of the first semiconductor fin includes the p-type dopant, and when the top transistor is the PMOS transistor, the bottom region of the first semiconductor fin includes the n-type dopant.

Example 26 includes the IC structure of any of Examples 16-25, where the top portions of the first and second semiconductor fins include a first semiconductor material, and the bottom portions of the first and second semiconductor fins include a second semiconductor material different than the first semiconductor material.

Example 27 includes the IC structure of Example 26, where the top and bottom portions of the second semiconductor fin meet to form a heterojunction, and the vertical diode is a heterojunction diode.

Example 28 includes the IC structure of Example 27, where the heterojunction diode is a first heterojunction diode, the IC structure further including a second heterojunction diode sharing a common said bottom portion of the second semiconductor fin with the first heterojunction diode, the first and second heterojunction diodes together making up a heterojunction transistor.

Example 29 includes the IC structure of any of Examples 16-28, where the bottom transistor includes bottom source and drain regions, and a semiconductor region of the bottom portion of the first semiconductor fin adjacent to and connecting the bottom source and drain regions, the top transistor includes top source and drain regions, and a semiconductor region of the top portion of the first semiconductor fin adjacent to and connecting the top source and drain regions, and the semiconductor regions of the top and bottom portions of the first semiconductor fin are vertically aligned.

Example 30 includes the IC structure of Example 29, where the bottom transistor further includes a bottom gate structure on the semiconductor region of the bottom portion of the first semiconductor fin, the top transistor further includes a top gate structure on the semiconductor region of the top portion of the first semiconductor fin, and the top and bottom gate structures are vertically aligned.

Example 31 is a method of fabricating an integrated circuit structure, the method including: forming a semiconductor fin extending horizontally in a length direction, the semiconductor fin including a bottom portion, and a top portion above the bottom portion; forming a bottom transistor using the bottom portion of the semiconductor fin; forming a top transistor above the bottom transistor using the top portion of the semiconductor fin; and forming a vertical diode using the semiconductor fin, the forming of the vertical diode including forming a bottom region using at least the bottom portion of the semiconductor fin, the bottom region including one of n-type and p-type dopant, forming a top region using at least the top portion of the semiconductor fin, the top region including the other of n-type and p-type dopant, forming a bottom terminal electrically connected to the bottom region, and forming a top terminal electrically connected to the top region at the top portion of the semiconductor fin.

Example 32 includes the method of Example 31, where the semiconductor fin is a first semiconductor fin, the vertical diode is a first vertical diode, and the method further includes: forming a second semiconductor fin extending horizontally in the length direction, the second semiconductor fin including a bottom portion, and a top portion above the bottom portion; forming a second vertical diode using the second semiconductor fin, the forming of the second vertical diode including forming a bottom region using at least the bottom portion of the second semiconductor fin, the bottom region including the one of n-type and p-type dopant, forming a top region using at least the top portion of the second semiconductor fin, the top region including the other of n-type and p-type dopant, forming a bottom terminal electrically connected to the bottom region, and forming a top terminal electrically connected to the top region at the top portion of the second semiconductor fin; and electrically connecting the top and bottom terminals of the second vertical diode to the top and bottom terminals, respectively, of the first vertical diode to electrically connect the first and second vertical diodes in parallel.

Example 33 includes the method of any of Examples 31-32, where for the vertical diode, the bottom region is below the top region, the bottom terminal is below the top terminal, and the bottom terminal is electrically connected to the bottom region at the bottom portion of the semiconductor fin.

Example 34 includes the method of Example 33, where the top and bottom terminals of the vertical diode are vertically aligned.

Example 35 includes the method of any of Examples 31-32, where the forming of the vertical diode further includes forming a second top region using at least the top portion of the semiconductor fin, the second top region including the one of n-type and p-type dopant, for the vertical diode, the bottom region is below the top and second top regions, and the forming of the bottom terminal includes further electrically connecting the bottom terminal to the second top region at the top portion of the semiconductor fin.

Example 36 includes the method of Example 35, where the forming of the vertical diode further includes forming an insulation region between the top and second top regions to electrically separate the top and second top regions within the top portion of the semiconductor fin.

Example 37 includes the method of any of Examples 35-36, where the top and bottom terminals of the vertical diode are horizontally aligned.

Example 38 includes the method of any of Examples 31-37, where the top and bottom regions of the vertical diode meet to form a p-n junction.

Example 39 includes the method of any of Examples 31-38, where the top transistor is one of an n-type metal oxide semiconductor (NMOS) transistor and a p-type MOS (PMOS) transistor, the bottom transistor is the other of the NMOS transistor and the PMOS transistor, and the top and bottom transistors make up a complementary MOS (CMOS) transistor structure.

Example 40 includes the method of Example 39, where when the top transistor is the NMOS transistor, the top region of the semiconductor fin includes the n-type dopant, and when the top transistor is the PMOS transistor, the top region of the semiconductor fin includes the p-type dopant.

Example 41 includes the method of any of Examples 31-40, where the top portion of the semiconductor fin includes a first semiconductor material, and the bottom portion includes a second semiconductor material different than the first semiconductor material.

Example 42 includes the method of Example 41, where the top and bottom portions of the semiconductor fin meet to form a heterojunction, and the vertical diode is a heterojunction diode.

Example 43 includes the method of Example 42, where the heterojunction diode is a first heterojunction diode, the method further including forming a second heterojunction diode sharing a common said bottom portion of the semiconductor fin with the first heterojunction diode, the first and second heterojunction diodes together making up a heterojunction transistor.

Example 44 includes the method of any of Examples 31-43, where the forming of the bottom transistor includes forming bottom source and drain regions, with a semiconductor region of the bottom portion of the semiconductor fin being adjacent to and connecting the bottom source and drain regions, the forming of the top transistor includes forming top source and drain regions, with a semiconductor region of the top portion of the semiconductor fin being adjacent to and connecting the top source and drain regions, and the semiconductor regions of the top and bottom portions of the semiconductor fin are vertically aligned.

Example 45 includes the method of Example 44, where the forming of the bottom transistor further includes forming a bottom gate structure on the semiconductor region of the bottom portion of the semiconductor fin, the forming of the top transistor further includes forming a top gate structure on the semiconductor region of the top portion of the semiconductor fin, and the top and bottom gate structures are vertically aligned.

Example 46 is a method of fabricating an integrated circuit structure, the method including: forming first and second semiconductor fins extending horizontally in a length direction, each semiconductor fin including a bottom portion, and a top portion above the bottom portion; forming a bottom transistor using the bottom portion of the first semiconductor fin; forming a top transistor above the bottom transistor using the top portion of the first semiconductor fin; and forming a vertical diode using the second semiconductor fin, the forming of the vertical diode including forming a bottom region using at least the bottom portion of the second semiconductor fin, the bottom region including one of n-type and p-type dopant, forming a top region using at least the top portion of the second semiconductor fin, the top region including one of n-type and p-type dopant, forming a bottom terminal electrically connected to the bottom region, and forming a top terminal electrically connected to the top region at the top portion of the second semiconductor fin.

Example 47 includes the method of Example 46, where the vertical diode is a first vertical diode, the method further including: forming a third semiconductor fin extending horizontally in the length direction, the third semiconductor fin including a bottom portion, and a top portion above the bottom portion; forming a second vertical diode using the third semiconductor fin, the forming of the second vertical diode including forming a bottom region using at least the bottom portion of the third semiconductor fin, the bottom region including the one of n-type and p-type dopant, forming a top region using at least the top portion of the third semiconductor fin, the top region including the other of n-type and p-type dopant, forming a bottom terminal electrically connected to the bottom region, and forming a top terminal electrically connected to the top region at the top portion of the third semiconductor fin; and electrically connecting the top and bottom terminals of the second vertical diode to the top and bottom terminals, respectively, of the first vertical diode to electrically connect the first and second vertical diodes in parallel.

Example 48 includes the method of any of Examples 46-47, where for the vertical diode, the bottom region is below the top region, the bottom terminal is below the top terminal, and the bottom terminal is electrically connected to the bottom region at the bottom portion of the second semiconductor fin.

Example 49 includes the method of Example 48, where the top and bottom terminals of the vertical diode are vertically aligned.

Example 50 includes the method of any of Examples 46-47, where the forming of the vertical diode further includes forming a second top region using at least the top portion of the second semiconductor fin, the second top region including the one of n-type and p-type dopant, for the vertical diode, the bottom region is below the top and second top regions, and the forming of the bottom terminal includes further electrically connecting the bottom terminal to the second top region at the top portion of the second semiconductor fin.

Example 51 includes the method of Example 50, where the forming of the vertical diode further includes forming an insulation region between the top and second top regions to electrically separate the top and second top regions within the top portion of the second semiconductor fin.

Example 52 includes the method of any of Examples 50-51, where the top and bottom terminals of the vertical diode are horizontally aligned.

Example 53 includes the method of any of Examples 46-52, where the top transistor is one of an n-type metal oxide semiconductor (NMOS) transistor and a p-type MOS (PMOS) transistor, the bottom transistor is the other of the NMOS transistor and the PMOS transistor, and the top and bottom transistors make up a complementary MOS (CMOS) transistor structure.

Example 54 includes the method of Example 53, where when the top transistor is the NMOS transistor, the top regions of the first and second semiconductor fins include the n-type dopant, and when the top transistor is the PMOS transistor, the top regions of the first and second semiconductor fins include the p-type dopant.

Example 55 includes the method of Example 54, where when the top transistor is the NMOS transistor, the bottom region of the first semiconductor fin includes the p-type dopant, and when the top transistor is the PMOS transistor, the bottom region of the first semiconductor fin includes the n-type dopant.

Example 56 includes the method of any of Examples 46-55, where the top portions of the first and second semiconductor fins include a first semiconductor material, and the bottom portions of the first and second semiconductor fins include a second semiconductor material different than the first semiconductor material.

Example 57 includes the method of Example 56, where the top and bottom portions of the second semiconductor fin meet to form a heterojunction, and the vertical diode is a heterojunction diode.

Example 58 includes the method of Example 57, where the heterojunction diode is a first heterojunction diode, the method further including forming a second heterojunction diode sharing a common said bottom portion of the second semiconductor fin with the first heterojunction diode, the first and second heterojunction diodes together making up a heterojunction transistor.

Example 59 includes the method of any of Examples 46-58, where the forming of the bottom transistor includes forming bottom source and drain regions, with a semiconductor region of the bottom portion of the first semiconductor fin being adjacent to and connecting the bottom source and drain regions, the forming of the top transistor includes forming top source and drain regions, with a semiconductor region of the top portion of the first semiconductor fin being adjacent to and connecting the top source and drain regions, and the semiconductor regions of the top and bottom portions of the first semiconductor fin are vertically aligned.

Example 60 includes the method of Example 59, where the forming of the bottom transistor further includes forming a bottom gate structure on the semiconductor region of the bottom portion of the first semiconductor fin, the forming of the top transistor further includes forming a top gate structure on the semiconductor region of the top portion of the first semiconductor fin, and the top and bottom gate structures are vertically aligned.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) structure comprising:
   a fin structure extending horizontally in a length direction, the fin structure including a bottom portion, and a top portion above the bottom portion, the top and bottom portions comprising semiconductor material;
   a bottom transistor associated with the bottom portion of the fin structure;
   a top transistor above the bottom transistor and associated with the top portion of the fin structure; and
   a vertical diode including a bottom region associated with at least the bottom portion of the fin structure, the bottom region comprising one of n-type and p-type dopant, a top region associated with at least the top portion of the fin structure, the top region comprising the other of n-type and p-type dopant, a bottom terminal electrically connected to the bottom region, and a top terminal electrically connected to the top region at the top portion of the fin structure.

2. The IC structure of claim 1, wherein the fin structure is a first fin structure, the vertical diode is a first vertical diode, and the IC structure further comprises:
   a second fin structure extending horizontally in the length direction, the second fin structure including a bottom portion, and a top portion above the bottom portion, the top and bottom portions of the second fin structure comprising semiconductor material; and a second vertical diode including a bottom region associated with at least the bottom portion of the second fin structure, the bottom region comprising the one of n-type and p-type dopant, a top region associated with at least the top portion of the second fin structure, the top region comprising the other of n-type and p-type dopant, a bottom terminal electrically connected to the bottom region, and a top terminal electrically connected to the top region at the top portion of the second fin structure, and wherein the top and bottom terminals of the second vertical diode are electrically connected to the top and bottom terminals, respectively, of the first vertical diode to electrically connect the first and second vertical diodes in parallel.

3. The IC structure of claim 1, wherein for the vertical diode, the bottom region is below the top region, the bottom terminal is below the top terminal, and the bottom terminal is electrically connected to the bottom region at the bottom portion of the fin structure.

4. The IC structure of claim 3, wherein the top and bottom terminals of the vertical diode are vertically aligned.

5. The IC structure of claim 1, wherein the vertical diode further includes a second top region associated with at least the top portion of the fin structure, and wherein for the vertical diode, the second top region comprises the one of n-type and p-type dopant, the bottom region is below the top and second top regions, and the bottom terminal is further electrically connected to the second top region at the top portion of the fin structure.

6. The IC structure of claim 5, wherein the vertical diode further comprises an insulation region between and electrically separating the top and second top regions within the top portion of the fin structure.

7. The IC structure of claim 5, wherein the top and bottom terminals of the vertical diode are horizontally aligned.

8. The IC structure of claim 1, wherein the top and bottom regions of the vertical diode meet to form a p-n junction.

9. The IC structure of claim 1, wherein the top transistor is one of an n-type metal oxide semiconductor (NMOS) transistor and a p-type MOS (PMOS) transistor, the bottom transistor is the other of the NMOS transistor and the PMOS transistor, and the top and bottom transistors make up a complementary MOS (CMOS) transistor structure.

10. The IC structure of claim 1, wherein the top portion of the fin structure comprises a first semiconductor material, and the bottom portion comprises a second semiconductor material compositionally different from the first semiconductor material.

11. The IC structure of claim 10, wherein the top and bottom portions of the fin structure meet to form a heterojunction, and the vertical diode is a heterojunction diode.

12. The IC structure of claim 11, wherein the heterojunction diode is a first heterojunction diode, the IC structure further comprising a second heterojunction diode sharing a common said bottom portion of the fin structure with the first heterojunction diode, the first and second heterojunction diodes together making up a heterojunction transistor.

13. The IC structure of claim 1, wherein: the bottom transistor comprises bottom source and drain regions, and a semiconductor region of the bottom portion of the fin structure adjacent to and connecting the bottom source and drain regions, and a bottom gate structure on the semiconductor region of the bottom portion of the fin structure; and the top transistor comprises top source and drain regions, and a semiconductor region of the top portion of the fin structure adjacent to and connecting the top source and drain regions, and a top gate structure on the semiconductor region of the top portion of the fin structure; and the semiconductor regions of the top and bottom portions of the fin structure are vertically aligned, and the top and bottom gate structures are vertically aligned.

14. An integrated circuit (IC) structure comprising:
first and second fin structures extending horizontally in a length direction, each fin structure including a bottom portion, and a top portion above the bottom portion, the top and bottom portions including semiconductor material;

a bottom transistor associated with the bottom portion of the first fin structure; a top transistor above the bottom transistor and associated with the top portion of the first fin structure; and a vertical diode including a bottom region associated with at least the bottom portion of the second fin structure, the bottom region comprising one of n-type and p-type dopant, a top region associated with at least the top portion of the second fin structure, the top region comprising the other of n-type and p-type dopant, a bottom terminal electrically connected to the bottom region, and a top terminal electrically connected to the top region at the top portion of the second fin structure.

15. The IC structure of claim 14, wherein the vertical diode is a first vertical diode, the IC structure further comprising:
a third fin structure extending horizontally in the length direction, the third fin structure including a bottom portion, and a top portion above the bottom portion; and a second vertical diode including a bottom region associated with at least the bottom portion of the third fin structure, the bottom region comprising the one of n-type and p-type dopant, a top region associated with at least the top portion of the third fin structure, the top region comprising the other of n-type and p-type dopant, a bottom terminal electrically connected to the bottom region, and a top terminal electrically connected to the top region at the top portion of the third fin structure, wherein the top and bottom terminals of the second vertical diode are electrically connected to the top and bottom terminals, respectively, of the first vertical diode to electrically connect the first and second vertical diodes in parallel.

16. The IC structure of claim 14, wherein the top portions of the first and second fin structures comprise a first semiconductor material, and the bottom portions of the first and second fin structures comprise a second semiconductor material different than the first semiconductor material.

17. An integrated circuit (IC) structure comprising:
a fin structure including a bottom portion and a top portion above the bottom portion, the bottom and top portions including semiconductor material; and a diode including a bottom region associated with at least the bottom portion of the fin structure, the bottom region comprising one of n-type and p-type dopant, a top region associated with at least the top portion of the fin structure, the top region comprising the other of n-type and p-type dopant, a bottom terminal electrically connected to and in lateral contact with a portion of the bottom region, and a top terminal electrically connected to the top region.

18. The IC structure of claim 17, wherein the diode is a first diode associated with a first section of the fin structure, and the IC structure further comprises:

a second diode associated with a second section of the fin structure and including a bottom region associated with at least the bottom portion of the second region of the fin structure, and a top region associated with at least the top portion of the second region of the fin structure, wherein the bottom terminal is also electrically connected to the bottom region of the second diode, and the top terminal is also electrically connected to the top region of the second diode, such that the first and second diodes are electrically connected in parallel.

19. The IC structure of claim 17, further comprising a transistor device associated with one of the bottom portion of the fin structure, the top portion of the fin structure, or a top or bottom portion of another fin structure that is either adjacent and parallel to the fin structure or collinear with the fin structure.

20. The IC structure of claim 17, wherein the bottom portion of the fin structure comprises a first Group III-V semiconductor material, and the top portion of the semiconductor fin comprises a second Group III-V semiconductor material that is compositionally distinct from the first Group III-V semiconductor material.

* * * * *